(12) United States Patent
Miyakoshi et al.

(10) Patent No.: US 6,635,926 B2
(45) Date of Patent: Oct. 21, 2003

(54) FIELD EFFECT TRANSISTOR WITH HIGH WITHSTAND VOLTAGE AND LOW RESISTANCE

(75) Inventors: Nobuki Miyakoshi, Saitama (JP);
Toshiki Matsubara, Saitama (JP);
Hideyuki Nakamura, Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 09/908,540

(22) Filed: Jul. 20, 2001

(65) Prior Publication Data

US 2002/0024056 A1 Feb. 28, 2002

(30) Foreign Application Priority Data

Aug. 30, 2000 (JP) ........................... 2000-260598
Dec. 22, 2000 (JP) ........................... 2000-390830

(51) Int. Cl.⁷ ............................................. H01L 29/78
(52) U.S. Cl. ................... 257/342; 257/133; 257/135; 257/341
(58) Field of Search .................. 257/144, 328, 257/339–342, 133, 135, 155, 152–153, 166, 287, 327–330, 401

(56) References Cited

U.S. PATENT DOCUMENTS

| | | | | |
|---|---|---|---|---|
| 4,376,286 A | * | 3/1983 | Lidow et al. | 257/342 |
| 4,680,853 A | | 7/1987 | Lidow et al. | 438/268 |
| 5,525,816 A | * | 6/1996 | Takahashi | 257/139 |
| 5,661,314 A | | 8/1997 | Merrill et al. | 257/144 |

\* cited by examiner

*Primary Examiner*—Minh Loan Tran
*Assistant Examiner*—Thomas L Dickey
(74) *Attorney, Agent, or Firm*—Armstrong, Westerman & Hattori, LLP.

(57) ABSTRACT

A field effect transistor with a high withstand voltage and a low resistance is provided. A ring-shaped channel region is disposed inside a source region formed in a ring, and the inside of the channel region is taken as a drain region. A depletion layer extends toward the inside of the drain region, resulting in a high withstand voltage. In the portion, except the portion within a prescribed distance from the corner portion of the channel region, a low resistance conductive layer is disposed, thereby resulting in high withstand voltage.

7 Claims, 43 Drawing Sheets

46  54          48          21a  53  45

FIELD EFFECT TRANSISTOR WITH HIGH WITHSTAND VOLTAGE AND LOW RESISTANCE

BACKGROUND OF THE INVENTION

1. Field of the Invention

The present invention relates to a field effect transistor, and more particularly, it relates to a field effect transistor with a high withstand voltage and a low resistance.

2. Description of the Related Art

Conventionally, a field effect transistor in which a current flows in the direction of the thickness of a substrate has been used as a current control element.

Referring now to FIG. 26, a reference numeral 105 denotes one example of a conventional type of a field effect transistor, and it has a single crystal silicon substrate 111. On the surface of the single crystal substrate 111, a drain region 112 formed by epitaxial growth is disposed.

Within the single crystal silicon substrate 111, N-type impurities are doped to a high concentration and a drain electrode film 148 is formed on the backside thereof. Within the drain region 112, N-type impurities are doped to a low concentration, and a P-type base region 154 is formed in the vicinity of the surface thereof.

Within the base region 154, N-type impurities are further diffused from the surface to form a source region 161.

A reference numeral 110 denotes a channel region located between the edge portion of the source region 161 and the edge portion of the base region 154. On tip of the channel region 110, a gate insulation film 126 and a gate electrode film 127 are disposed in this order.

On the surface and the sides of the gate electrode film 127, an interlayer insulation film 141 is formed, and a source electrode film 144 is formed on the surface thereof.

The base regions 154 as described above are disposed in islands in the vicinity of the surface of the drain region 112, and one base region 154, and the source region 161 and the channel region 110 disposed within the base region 154 form one cell 101.

FIG. 27 is a plan view showing the surface of the drain region 112, wherein a plurality of rectangular cells 101 are arranged in matrix.

In the case where the field effect transistor 105 is used, when the source electrode film 144 is set at a ground potential, a positive voltage is applied to the drain electrode film 148, and a gate voltage (positive voltage) of equal to or greater than the threshold voltage is applied to the gate electrode film 127, an N-type inversion layer is formed on the surface of the P-type channel region 110 so that the source region 161 and the drain region 112 are connected to each other through the inversion layer, thereby rendering the field effect transistor 105 conductive.

When a voltage of equal to or smaller than the threshold voltage (e.g., ground voltage) is applied to the gate electrode film 127 from such a state, the inversion layer disappears so that the field effect transistor 105 is cut off.

However, when a large number of the cells 101 as described above are arranged, an attempt to increase the withstand voltage requires a decrease in the distance between the cells 101, and hence the gate electrode width is decreased, thereby resulting in an increase in conduction resistance.

Further, the withstand voltage is determined by the corner portion of the cell 101, and hence there is still a problem in that even if the distance between the cells 101 is decreased, the withstand voltage is not so improved as expected.

SUMMARY OF THE INVENTION

The present invention has been made in order to solve the foregoing deficiencies in the prior art. It is therefore an object of the present invention to provide a high withstand voltage and low resistance field effect transistor.

For solving the foregoing problem, a first aspect of the present invention is a field effect transistor, comprising: a main diffused region of a second conductivity type formed within a high resistance layer of a first conductivity type, and disposed on the surface side of the high resistance layer; a source region of the first conductivity type formed within the main diffused region, and disposed on the surface thereof; a ring-shaped channel region being formed in a ring, being a part of the main diffused region, and located between the edge of the main diffused region and the edge of the source region; a drain region surrounded by the ring-shaped channel region; a gate insulation film disposed at least on the channel region surface; and a gate electrode film disposed on the gate insulation film surface, the source region is located at an outer periphery of the ring-shaped channel region, the source region and the high resistance region being electrically connected with each other upon inversion of the channel region surface into the first conductivity type due to a voltage applied to the gate electrode film.

A second aspect of the present invention is the field effect transistor in accordance with the first aspect of the present invention, wherein the drain region surrounded by the ring-shaped channel region has at least one narrow elongate body portion, and a plurality of branch portions with their respective one ends connected to the body portion, and the ring-shaped channel region is disposed so as to surround the periphery of the body portion and the branch portions.

A third aspect of the present invention is the field effect transistor in accordance with the second aspect of the present invention, wherein the body portion located between the branch portions extends roundly toward the inside of the body portion itself.

A fourth aspect of the present invention is the field effect transistor in accordance with the third aspect of the present invention, wherein the channel region at each tip of the branch portions is configured with three sides intersecting with each other at substantially right angles.

A fifth aspect of the present invention is the field effect transistor in accordance with the third aspect of the present invention, wherein the main diffused region comprises a P-type base region and a P-type ohmic region having a deeper diffusion depth than that of the base region, a conductive layer of the first conductivity type with a lower resistance than that of the high resistance layer is disposed in the vicinity of the surface inside of the drain region, a pn junction is formed with the ohmic region and the conductive region at least on the surface of the tip portion of the portion extending roundly toward the inside of the body portion.

A sixth aspect of the present invention is the field effect transistor in accordance with the second aspects of the present invention, wherein a conductive layer of the first conductivity type with a lower resistance than that of the high resistance layer is disposed on the surface side of the inside of the drain region.

A seventh aspect of the present invention is the field effect transistor in accordance with the third aspect of the present invention, wherein a conductive layer of the first conductivity type with a lower resistance than that of the high resistance layer is disposed in each of the branch portions.

An eighth aspect of the present invention is the field effect transistor in accordance with the second aspect of the present invention, wherein a floating potential region of the second conductivity type not in contact with the channel region is disposed on the surface side of the inside of the drain region.

A ninth aspect of the present invention is the field effect transistor in accordance with the first aspect of the present invention, wherein the high resistance layer is disposed on a low resistance layer of the first conductivity type with a lower resistance than that of the high resistance layer, and a drain electrode film for forming an ohmic junction with the low resistance layer is disposed on the back side of the low resistance layer.

A tenth aspect of the present invention is the field effect transistor in accordance with the first aspect of the present invention, wherein an anode electrode film for forming a Schottky junction with the high resistance layer is disposed on the back side of the high resistance layer, such that a diode in which the anode electrode film is taken as an anode, and the high resistance layer is taken as a cathode is formed.

An eleventh aspect of the present invention is the field effect transistor in accordance with the first aspect of the present invention, wherein the high resistance layer is disposed on a collector layer of the second conductivity type, and a collector electrode film for forming an ohmic junction with the collector layer is disposed on the back side of the collector layer.

DETAILED DESCRIPTION OF THE PREFERRED EMBODIMENTS

A field effect transistor of the present invention will be described with reference to the drawings.

Figure 20A:
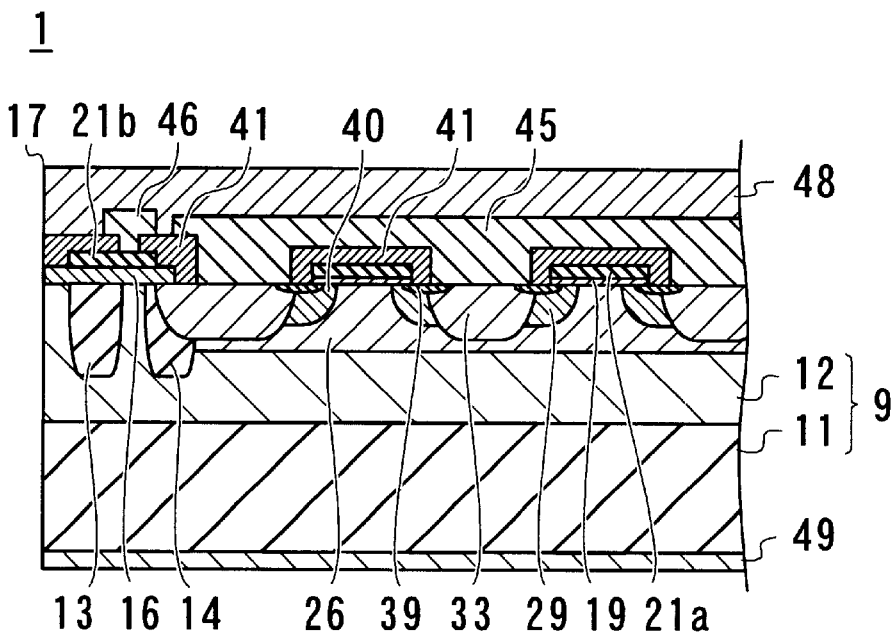
FIGS. 20(a) and 20(b) are views for illustrating the manufacturing process of the field effect transistor of the one example of the present invention.
Figure 20B:
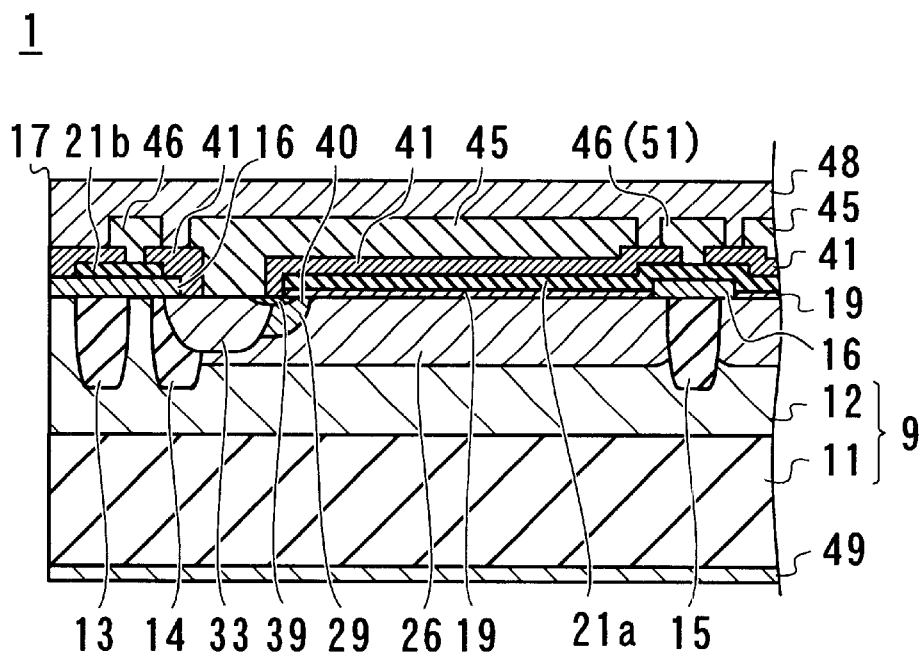

Referring now to FIGS. 20(a) and 20(b), a reference numeral 1 denotes the first example of field effect transistor of the present invention. FIGS. 20(a) and 20(b) are respectively cross sectional views orthogonal to each other of the field effect transistor 1.

The field effect transistor 1 has a substrate 9 which is a silicon wafer. The substrate 9 is comprised of a low resistance layer 11 made of single crystal silicon to which impurities have been doped in a relatively high concentration, and a high resistance layer 12 with a relatively high resistance, which has been grown by an epitaxial method on the low resistance layer 11.

Figure 21A:
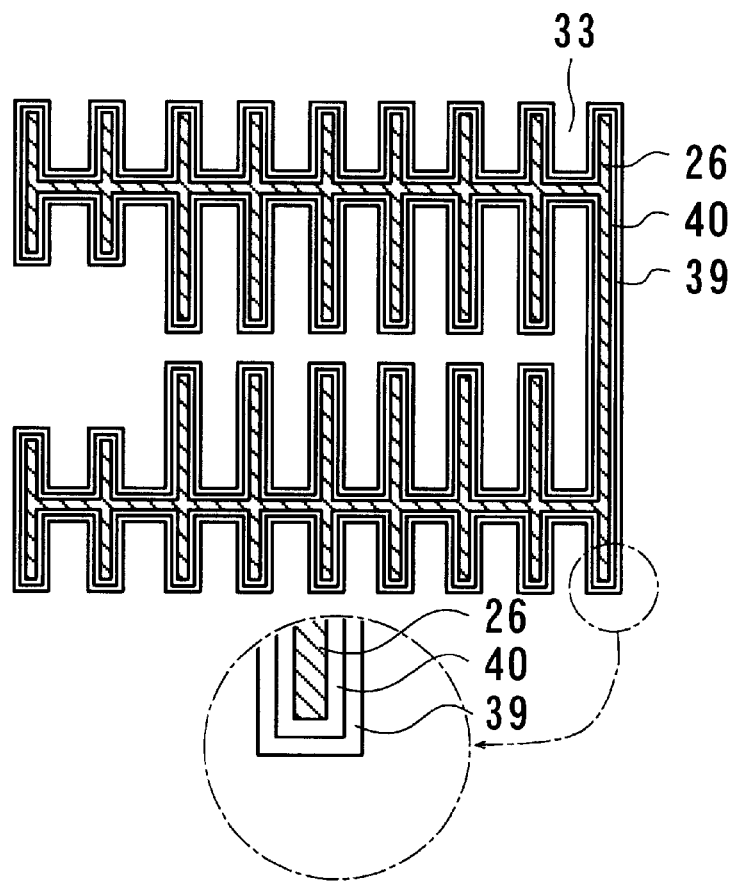
FIGS. 21(a) and 21(b) are views for illustrating the positional relationship among a conductive layer, a channel region, and a source region, and a fragmentary view thereof on an enlarged scale for illustrating the position of a floating potential region, respectively.
Figure 21B:
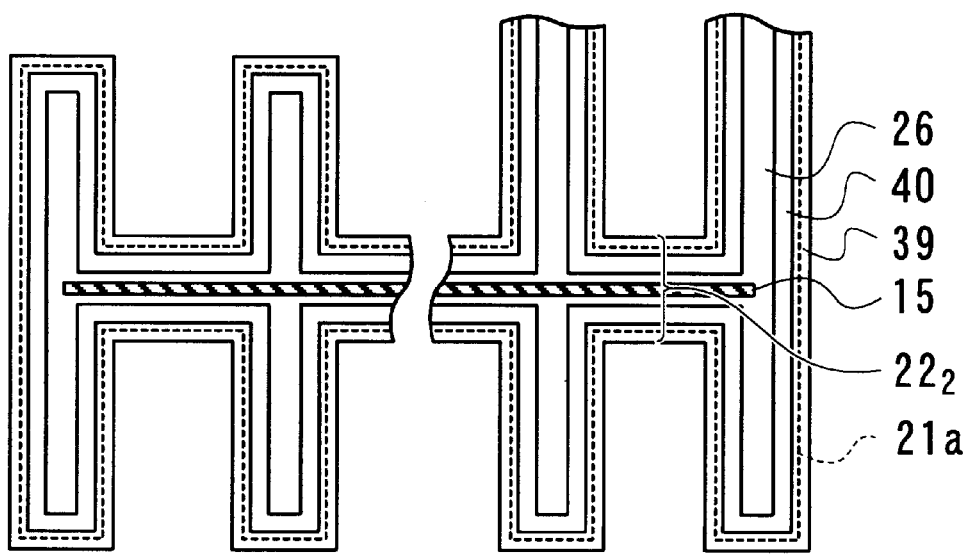

As shown in FIG. 21, a relatively high concentration N-type conductive layer 26 is disposed in the vicinity of the surface inside the high resistance layer 12 of the substrate 9. The conductive layer 26 takes the form of a comb in a plan configuration, and a P-type channel region 40 is located at the vicinity of the surface in the outer periphery of the conductive layer 26. An N-type source region 39 is disposed on at the further outer periphery of the channel region 40 in the vicinity of the surface inside the substrate 9. The source region 39 is formed within the P-type region which communicates with the channel region 40 so that an electric connection is provided between the source region 39 and the conductive layer 26 when the channel region 40 in the vicinity of the surface is inverted to N-type. The source region 39 is in contact with the channel region 40, and surrounds the channel region 40.

Figure 1A:
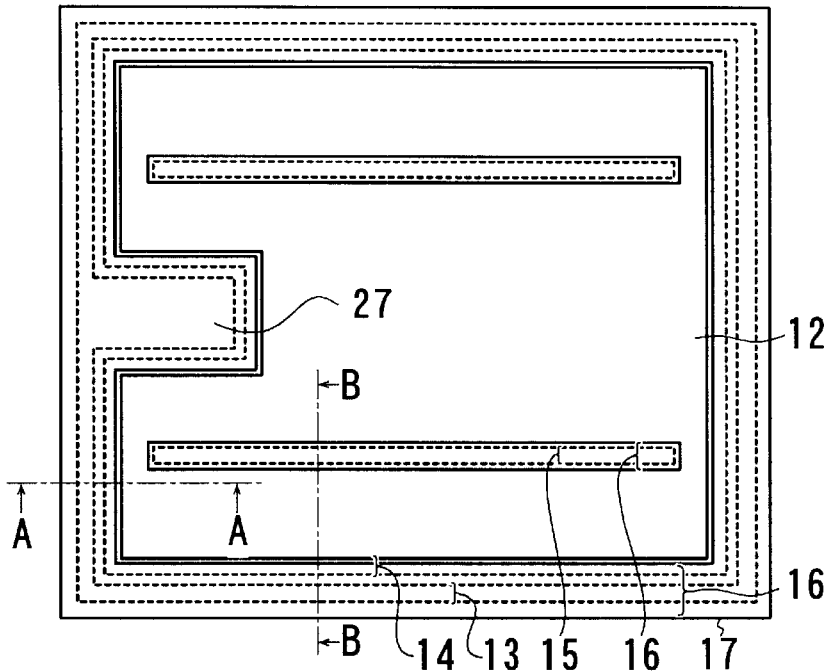
FIGS. 1(a) to 1(c) are views for illustrating the manufacturing process of a field effect transistor of one example of the present invention.
Figure 1B:
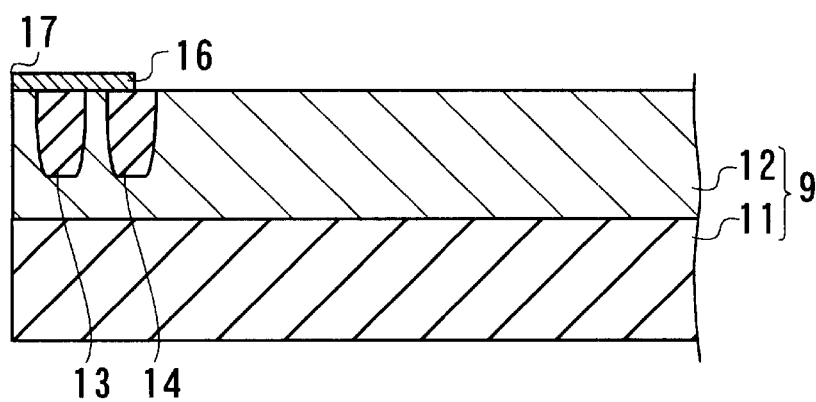
Figure 1C:
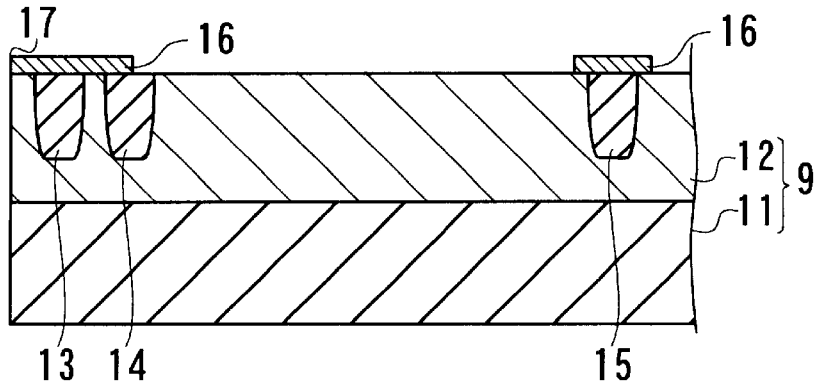

The manufacturing process of the field effect transistor will be described. Referring to FIGS. 1(a) to 1(c), first, the substrate 9 composed of a laminate of the N-type low resistance layer 11 and the N-type high resistance layer 12 is prepared. Then, P-type impurities are partially injected into the surface of the high resistance layer 12, and diffused to form P-type first and second guard ring regions 13 and 14, and a floating potential region 15. Subsequently, a silicon dioxide film is formed on the surface thereof, followed by patterning to form a field insulation film 16. FIGS. 1(a) to 1(c) show respective states of the substrate 9 during the foregoing process. FIG. 1(a) is a plan view of the high resistance layer 12 surface side of the substrate 9, FIG. 1(b) is a cross-sectional view taken along the line A—A showing the substrate 9, and FIG. 1(c) is a cross-sectional view taken along the line B—B showing the substrate 9.

The first and second guard ring regions 13 and 14, and the floating potential region 15 are diffused to the same depth, and the bottoms thereof are not in contact with the low resistance layer 11. The second guard ring region 14 is connected to a source electrode film described below, and set at the same potential as that of the source region. The first guard ring region 13 and the floating potential region 15 are not connected to the source electrode film and a gate electrode film, and set at a floating potential.

The first and second guard ring regions 13 and 14 are each in a ring form. The first guard ring region 13 is disposed along the outer periphery of the substrate 9, while the second guard ring region 14 is disposed on the inside of the first guard ring region 13.

A reference numeral 17 denotes the edge portion of the region constituting one field effect transistor within this substrate 9. Within the substrate 9, a plurality of field effect transistors are formed, and they are to be cut off from each other at the outer position than the edge portion 17 in a dicing process.

The first and second guard ring regions 13 and 14 are disposed in the vicinity of the edge portion 17. The inside of the second guard ring region 14 is an active region where a base region, a source region, and the like described later are to be located.

The floating potential region 15 has the shape of a narrow elongate rectangle, and the floating potential region 15 is disposed within the active region on the inside of the second guard ring region 14. Herein, two floating potential regions 15 are provided in a parallel arrangement at their respective spaced apart positions.

The field insulation film 16 is divided into a portion covering the surface of the floating potential region 15, and another portion covering the surface of the first guard ring region 13 and a part of the surface of the second guard ring region 14.

The field insulation film 16 has a pad portion 27 formed with a large area, and on the pad portion 27, a gate pad described later is to be formed.

Figure 2A:
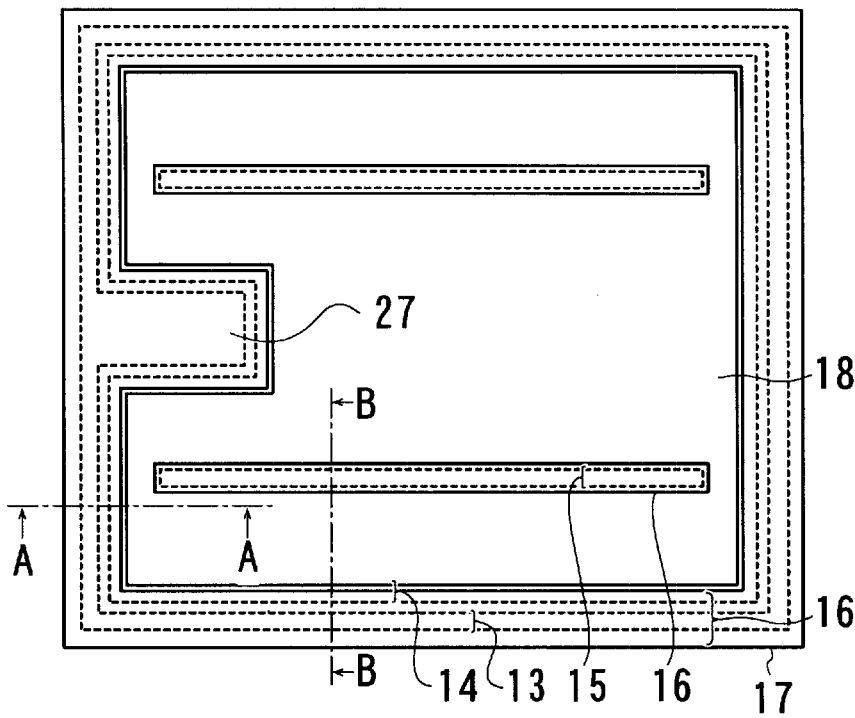
FIGS. 2(a) to 2(c) are views for illustrating the manufacturing process of the field effect transistor of the one example of the present invention.

Then, N-type impurities are applied to the surface of substrate 9 by using the field insulation film 16 as a mask so that the impurities are injected into the surface of the high resistance layer 12. FIG. 2(a) is a plan view of the surface of the high resistance layer 12 in such a state, wherein a reference numeral 18 denotes a high-concentration impurity layer formed by injection of N-type impurities. Since the field insulation film 16 is disposed on the surfaces of the first guard ring diffusion layer 13 and the floating potential region 15, the high-concentration impurity layer 18 is not formed on those portions.

Figure 2B:
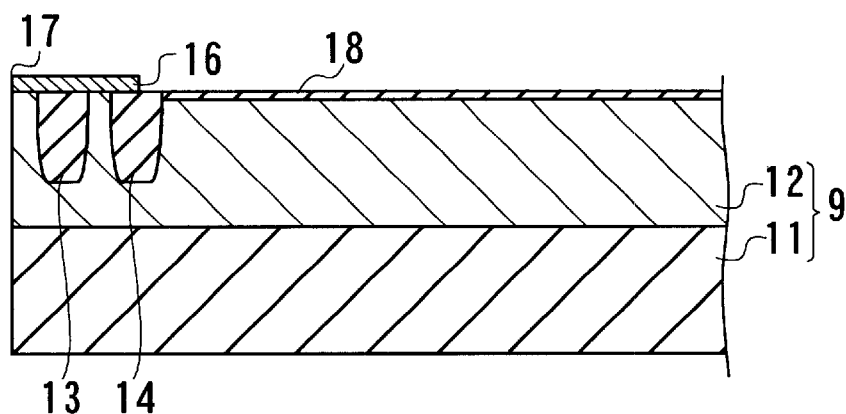
Figure 2C:
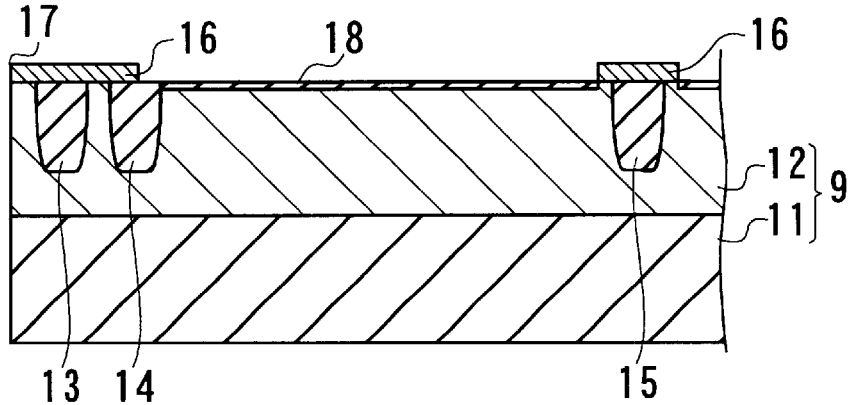

FIGS. 2(b) and 2(c) are across-sectional view taken along the line A—A, and a cross-sectional view taken along the line B—B of FIG. 2(a), respectively.

Since the concentration of the N-type impurities is lower than the surface concentration of the second guard ring region 14, the surface of the second guard ring region 14 does not become N-type. Therefore, the high-concentration impurity layer 18 is located within the active region inner than the second guard ring region 14.

Figure 3A:
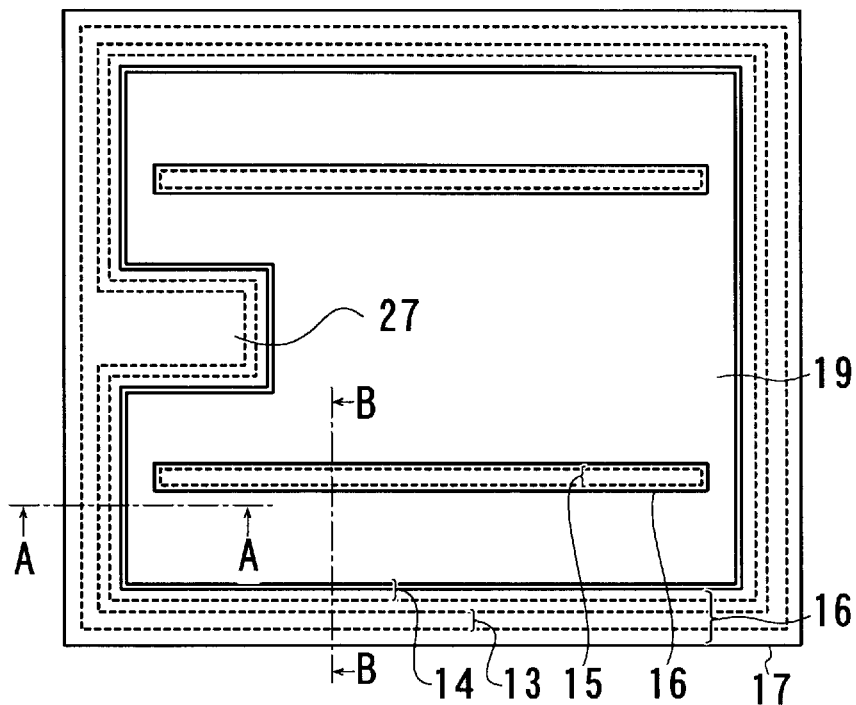
FIGS. 3(a) to 3(c) are views for illustrating the manufacturing process of the field effect transistor of the one example of the present invention.
Figure 3B:
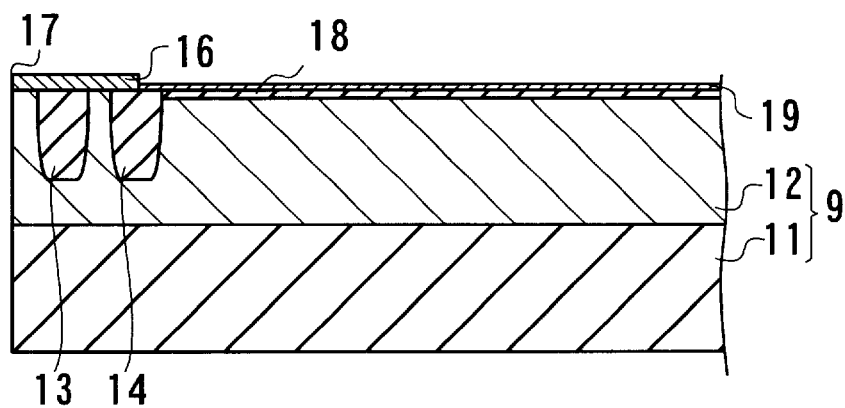
Figure 3C:
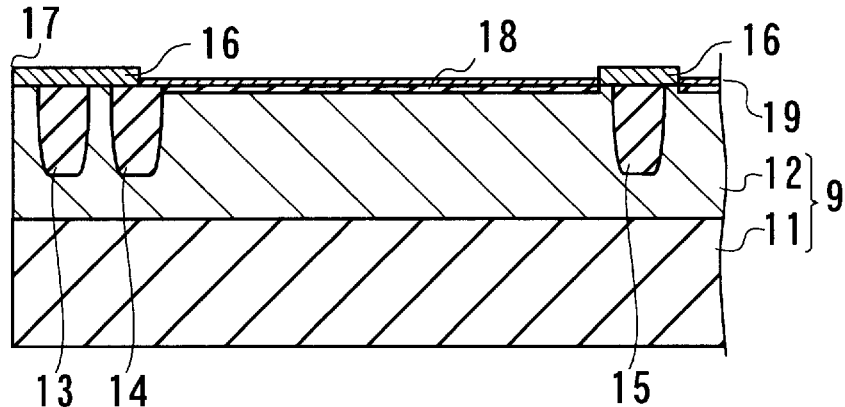

Then, upon oxidizing the surface of the substrate 9 by a thermal oxidation method, as shown in FIGS. 3(a) to 3(c), a gate insulation film 19 composed of an oxide film is formed on the inner periphery surface portion of the second guard ring region 14 and on the surface of the high-concentration impurity layer 18.

FIGS. 3(b) and 3(c) are a cross-sectional view taken along the line A—A, and a cross-sectional view taken along the line B—B of FIG. 3(a), respectively.

Figure 4A:
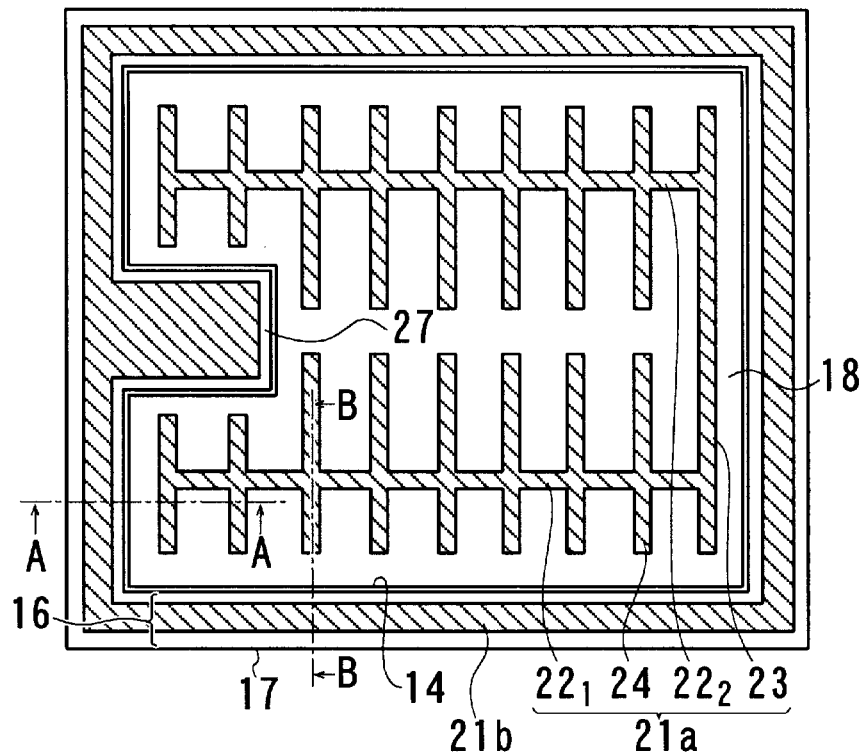
FIGS. 4(a) to 4(c) are views for illustrating the manufacturing process of the field effect transistor of the one example of the present invention.

A polysilicon thin film is formed on the entire surface of the substrate 9 in such a state by a CVD method, followed by patterning to form a gate electrode film. Reference numerals 21a and 21b in FIGS. 4(a) to 4(c) each denote a gate electrode film, which has been divided into two portions.

Out of the two gate electrode films 21a and 21b, the one gate electrode film 21a is situated within the active region on the inside of the second guard ring region 14, and disposed on the gate insulation film 19. The gate electrode film 21a at this portion is comprised of two elongately formed body portions $22_1$ and $22_2$, one connecting portion 23, and a plurality of branch portions 24.

The two body portions $22_1$ and $22_2$ are arranged in parallel with each other, and the connecting portion 23 is connected to respective one-end portions thereof. The end portions of the branch portions 24 are connected to respective body portions $22_1$ and $22_2$. The connecting portion 23 and respective branch portions 24 are perpendicular to the body portions $22_1$ and $22_2$.

The body portions $22_1$ and $22_2$ are located on the field insulation film 16 located within the active region on the inside of the second guard ring region 14. Therefore, floating potential regions 15 are located under the body portions $22_1$ and $22_2$, respectively.

The other gate electrode film 21b is disposed on the field insulation film 16 in the vicinity of the outer periphery, and formed in ring so as to surround the active region on the inside of the field insulation film 16. The gate electrode film 21b is formed with a large area on a pad portion 27 of the field insulation film 16.

Figure 5A:
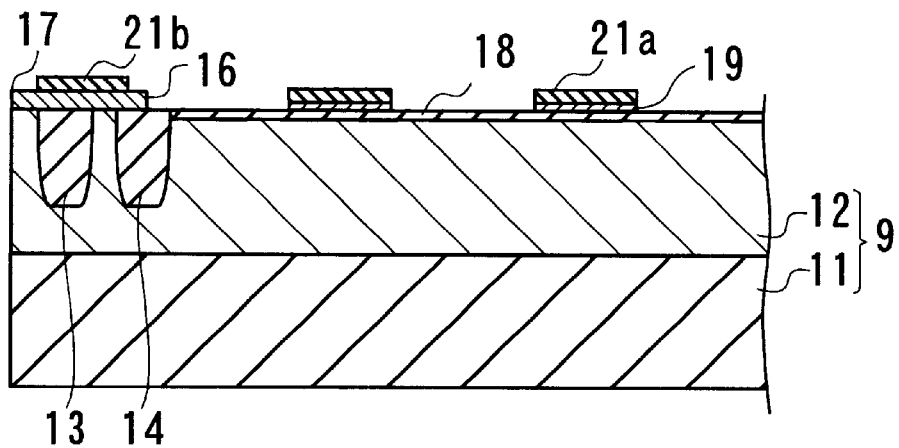
FIGS. 5(a) and 5(b) are views for illustrating the manufacturing process of the field effect transistor of the one example of the present invention.
Figure 5B:
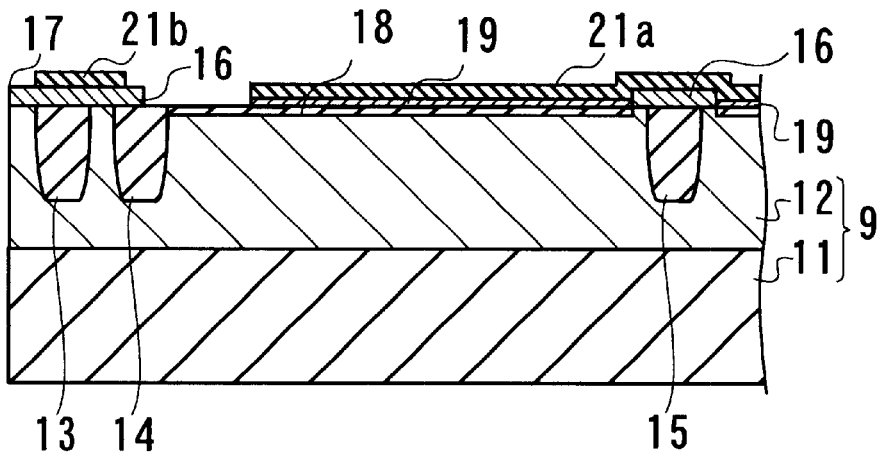

Then, the gate insulation film 19 is etched using the gate electrode film 21a disposed on the gate insulation film 19 as a mask, so that the gate insulation film 19 is patterned in the same plan configuration as that of the gate electrode film 21a as shown in FIGS. 5(a) and 5(b). In FIGS. 5(a) and 5(b), and FIGS. 6(a) to 8(b) described later, their respective plan views are omitted.

Figure 6A:
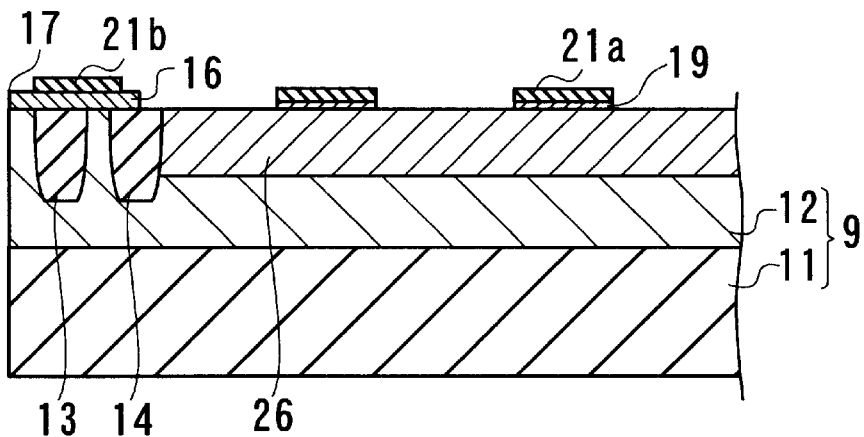
FIGS. 6(a) and 6(b) are views for illustrating the manufacturing process of the field effect transistor of the one example of the present invention.
Figure 6B:
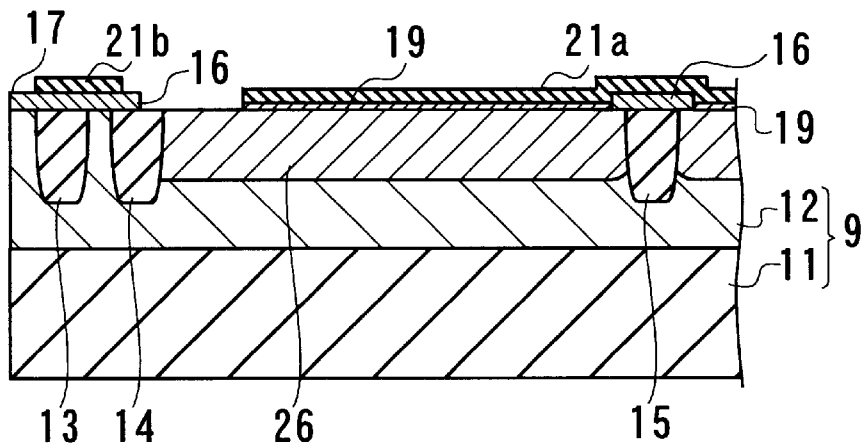

Subsequently, a high-concentration impurity layer 18 is diffused by a thermal treatment to form a conductive layer 26 as shown in FIGS. 6(a) and 6(b). The conductive layer 26 is of the same conductivity type as the high resistance layer 12. However, since it has a higher impurity concentration than that of the high resistance layer 12, it has a lower resistance than that of the high resistance layer 12.

Since the high-concentration impurity layer 18 is also disposed under the gate insulation film 19, the conductive layer 26 is formed within the active region on the inside of the second guard ring region 14 except for the portion where the floating potential region 15 is situated.

After the formation of the conductive layer 26, P-type impurities are applied to the surface of the substrate 9. The impurities do not pass through the gate electrode films 21a and 21b, and the field insulation film 16. Accordingly, the gate electrode film 21a serves as a mask on the inside of the field insulation film 16 so that the impurities are injected into the surface of the inner periphery portion of the second guard ring region 14 and the portion on which the conductive layer 26 is exposed.

Figure 7A:
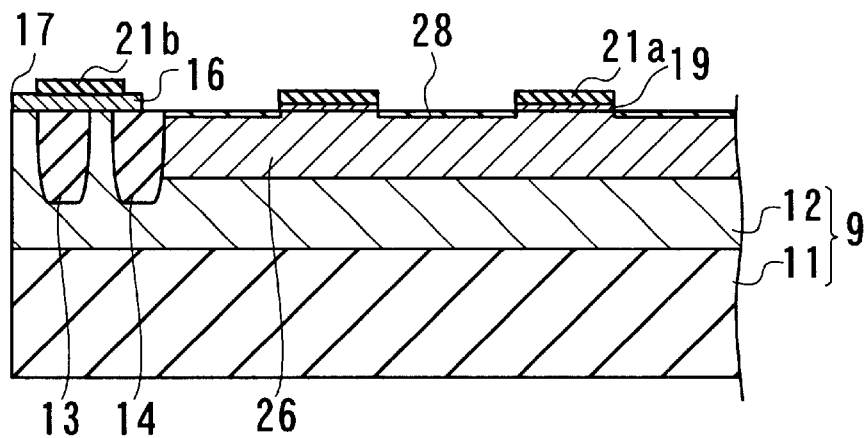
FIGS. 7(a) and 7(b) are views for illustrating the manufacturing process of the field effect transistor of the one example of the present invention.
Figure 7B:
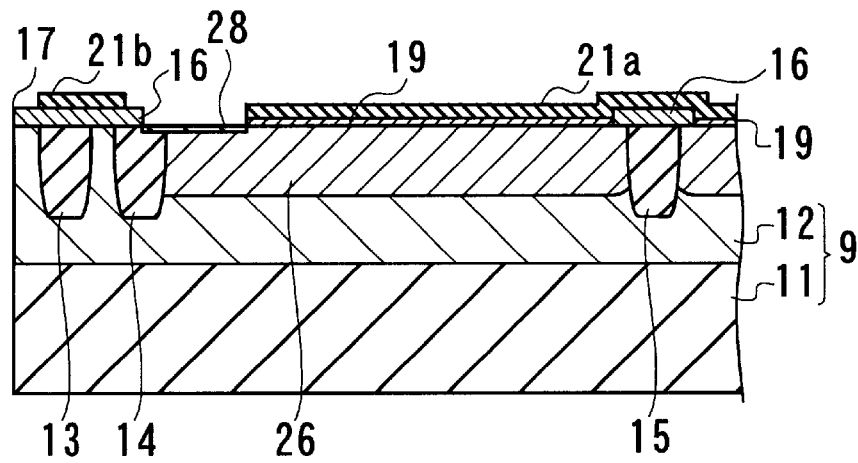

Consequently, as shown in FIGS. 7(a) and 7(b), a P-type high-concentration impurity layer 28 is formed around the gate insulation film 19. Namely, the gate insulation film 19 and the gate electrode film 21a on the surface thereof, and the portion of the conductive layer 26 immediately under the gate insulation film 19 are surrounded by the high-concentration impurity layer 28.

Figure 8A:
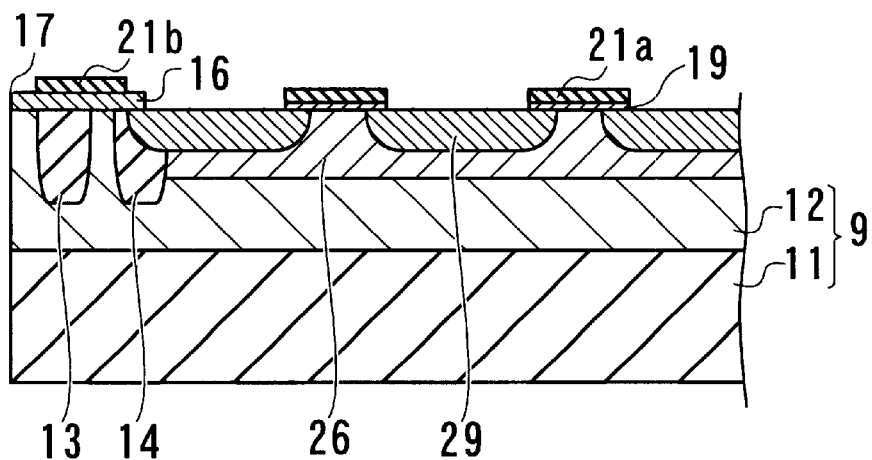
FIGS. 8(a) and 8(b) are views for illustrating the manufacturing process of the field effect transistor of the one example of the present invention.
Figure 8B:
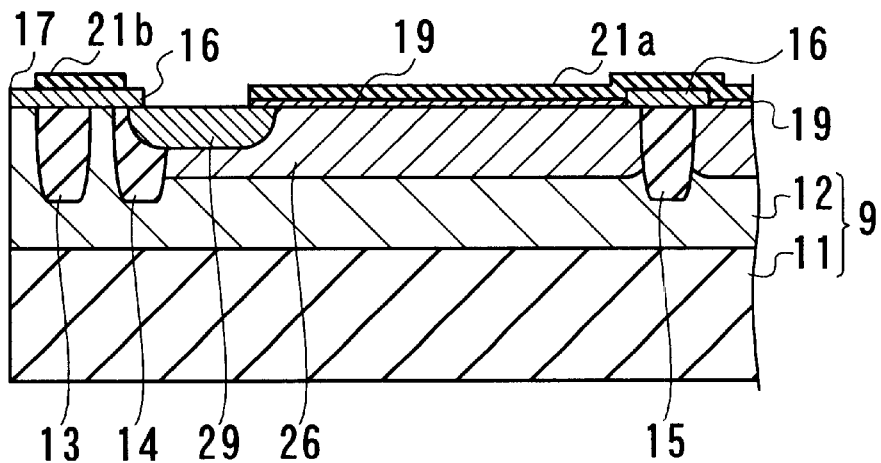

Then, the high-concentration impurity layer 28 is diffused by a thermal treatment to form a P-type base region 29 as shown in FIGS. 8(a) and 8(b). The outer periphery portion of the base region 29 is connected to the second guard ring layer 14.

Since the high-concentration impurity layer 28 is also diffused in a lateral direction, the inner periphery end portion of the base region 29 disposed under the outer periphery end portion of the gate insulation film 19.

Figure 9A:
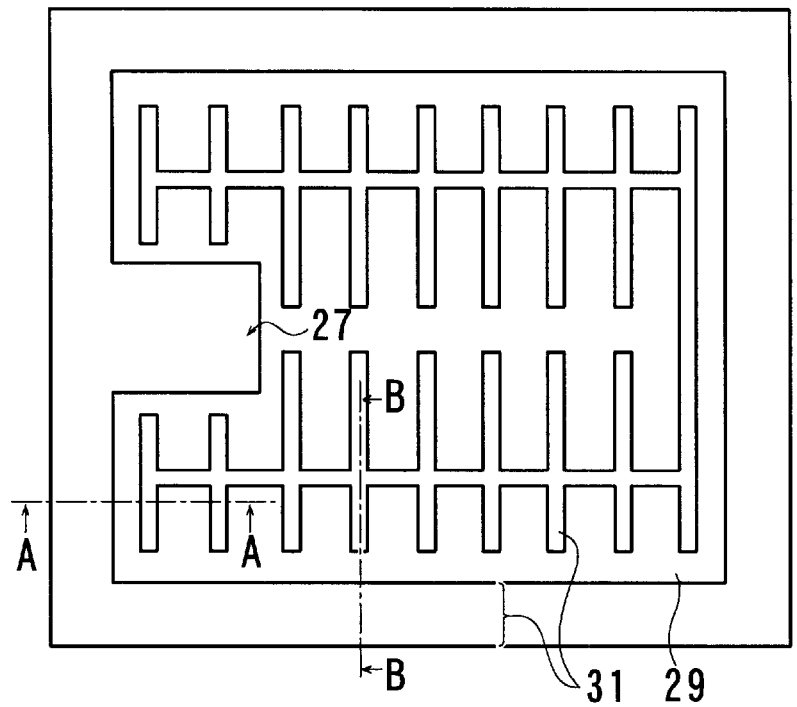
FIGS. 9(a) to 9(c) are views for illustrating the manufacturing process of the field effect transistor of the one example of the present invention.
Figure 9B:
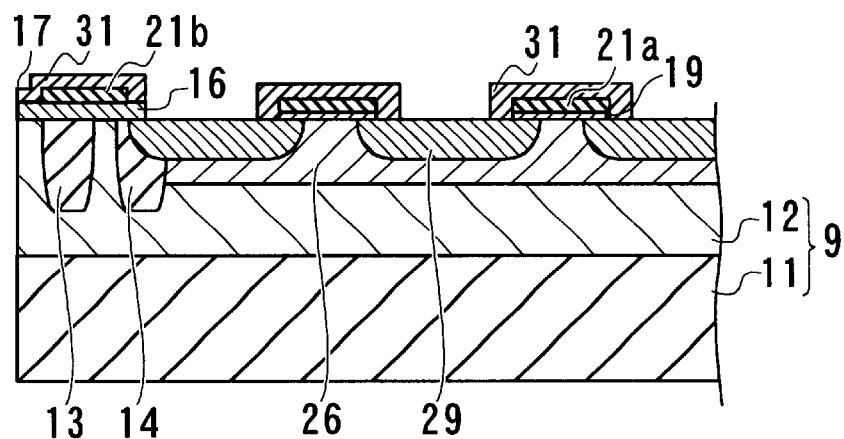
Figure 9C:
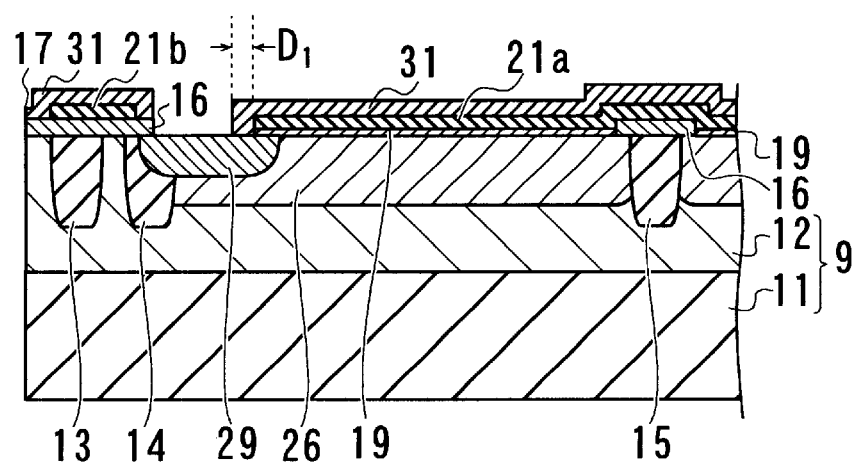

Then, a patterned resist film 31 is formed on the substrate surface as shown in FIGS. 9(a) to 9(c) in order to cover the surfaces of the gate electrode films 21a and 21b, and the surface of the base region 29 located in the vicinity of the gate electrode film 21a within the active region.

Figure 10A:
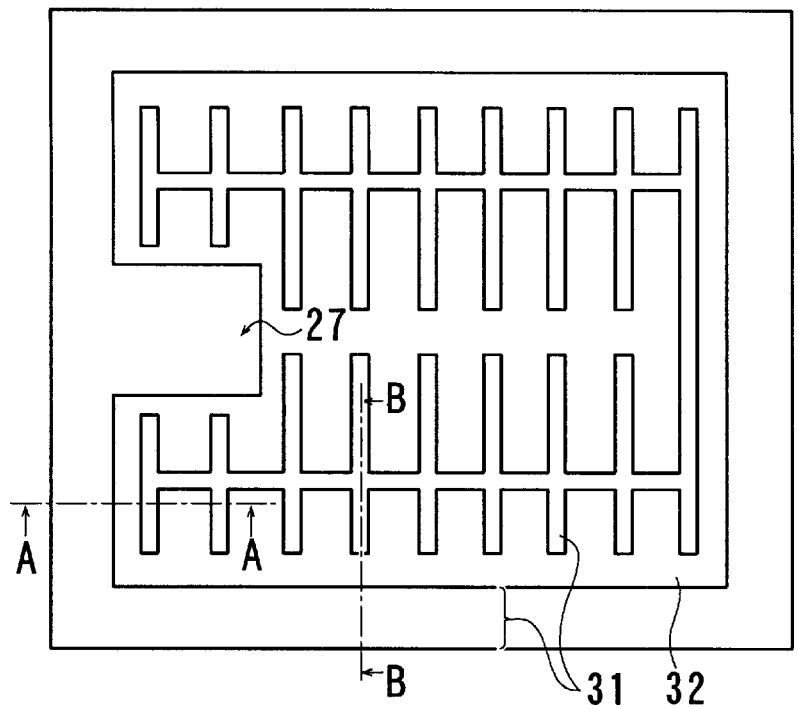
FIGS. 10(a) to 10(c) are views for illustrating the manufacturing process of the field effect transistor of the one example of the present invention.
Figure 10B:
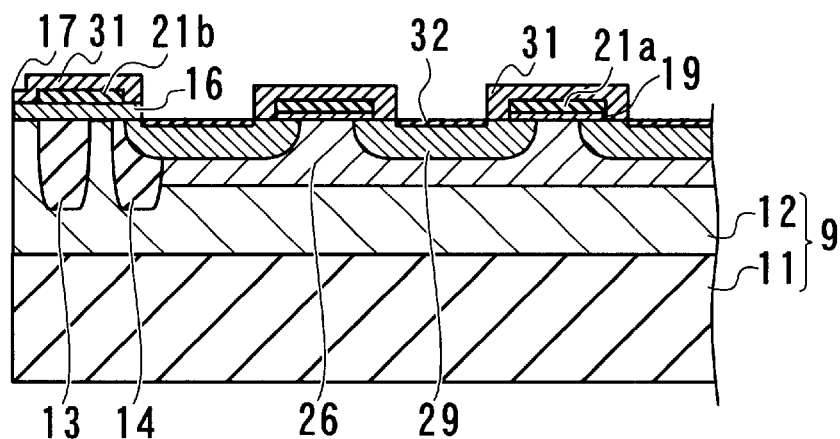
Figure 10C:
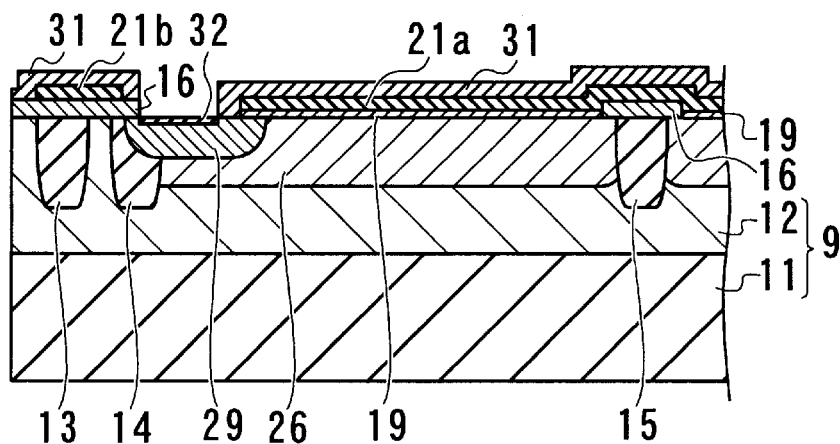

In this state, the surface of the base region 29 is partially exposed on the substrate. Then, P-type impurities are applied to the surface of the substrate 9 in such a state SO that the impurities are injected into the exposed portion of the base region 29 to form a P-type high-concentration impurity layer 32 as shown in FIGS. 10(a) to 10(c).

Figure 11A:
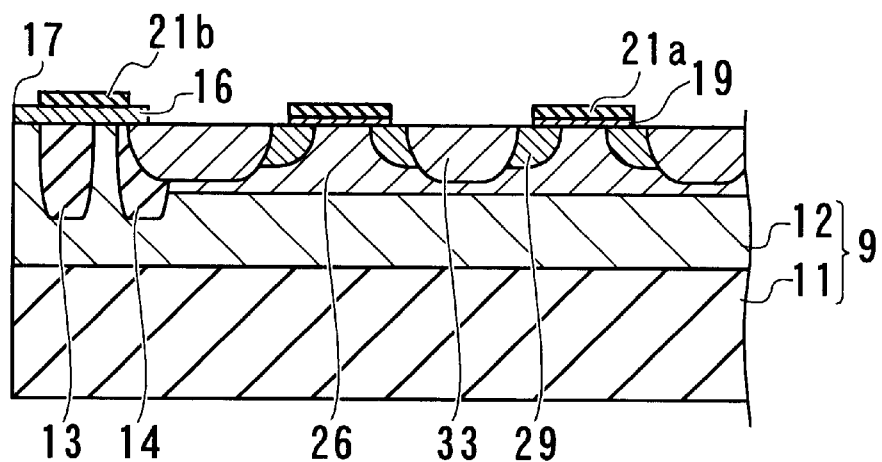
FIGS. 11(a) and 11(b) are views for illustrating the manufacturing process of the field effect transistor of the one example of the present invention.
Figure 11B:
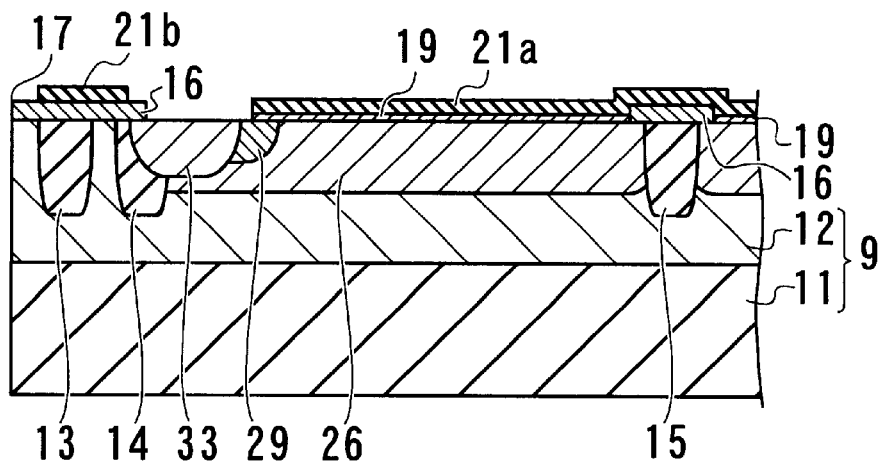

Then, after removing the resist film 31 therefrom, a thermal treatment is performed to diffuse the P-type high-concentration impurity layer 32, thereby resulting in the formation of a P-type ohmic region 33 as shown in FIGS. 11(a) and 11(b). The ohmic region 33 is a second conductivity type, which is the same as the base region 29, and is connected to the base region 29, and the ohmic region 33 and the base region 29 constitute a main diffused region.

The ohmic region 33 is apart from the gate electrode film 21a and the gate insulation film 19 by substantially the width of the resist film 31.

Further, the bottom of the ohmic region 33 is situated within the conductive layer 26, but diffused to the deeper position than the bottom of the base region 29.

It is noted that, the surface concentration of the ohmic region 33 is higher than the surface concentration of the base region 29, and a source electrode film described later is ohmic connected to the ohmic region 33, so that the base region 29 is connected to the source electrode film with a low resistance.

Figure 12A:
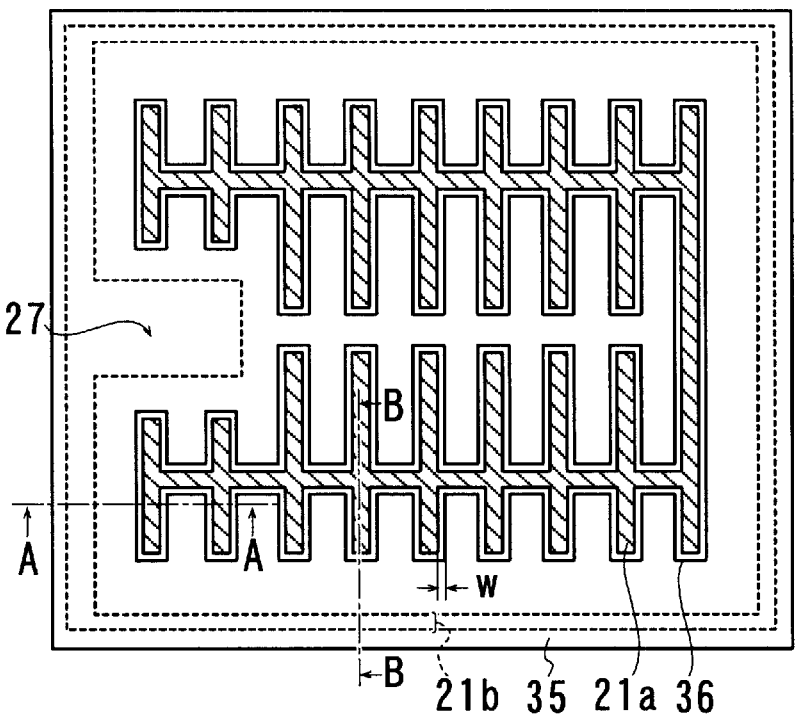
FIGS. 12(a) to 12(c) are views for illustrating the manufacturing process of the field effect transistor of the one example of the present invention.
Figure 12B:
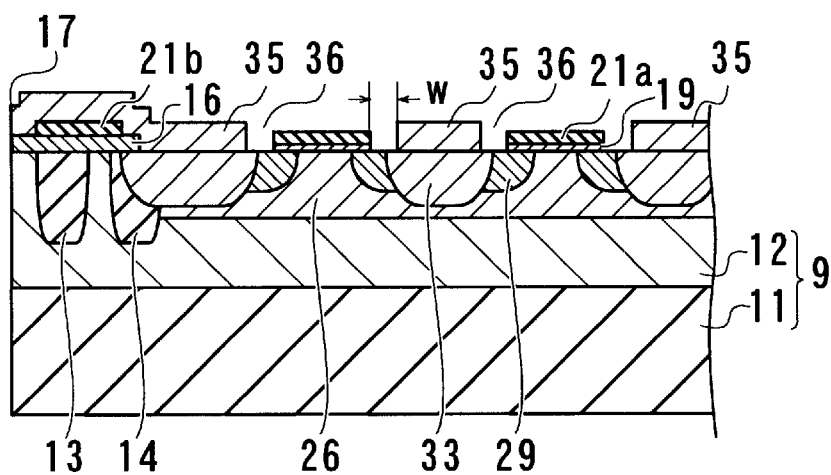
Figure 12C:
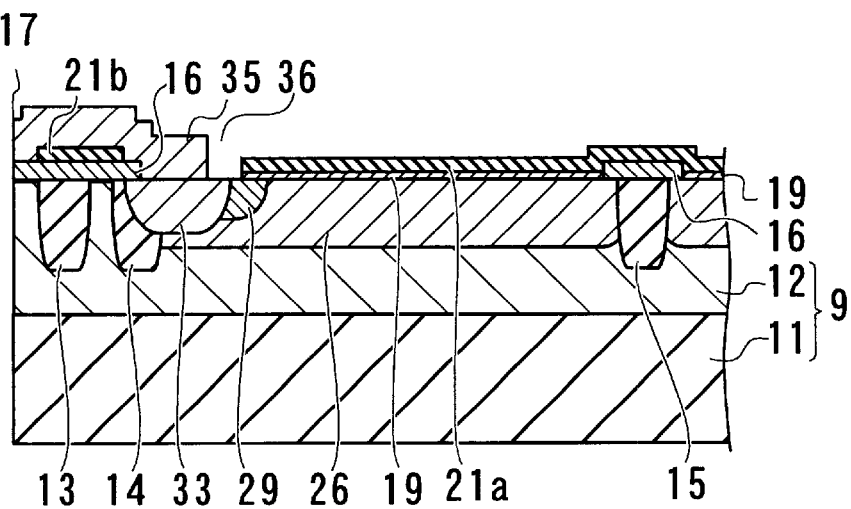

Then, as shown in FIGS. 12(a) to 12(c), a patterned resist film 35 is formed on the surface of the substrate 9. Thus, in a window portion 36 thereof, the surface of the gate electrode film 21a disposed on the gate insulation film 19, and the region apart from the gate electrode film 21a by a prescribed distance are exposed. Namely, the window portion 36 is similar in shape to, but one size larger than the gate electrode film 21a.

A reference numeral w denotes the distance between the end portion of the gate electrode film 21a exposed within the window portion 36 and the edge portion of the window portion 36.

In the range of the distance w, the surface of the base region 29 and a part of the surface of the ohmic region 33 are exposed.

Upon applying N-type impurities to the substrate in such a state, the resist film 35 and the gate electrode film 21a serve as masks so that the N-type impurities are injected in the portion not covered therewith. A reference numeral 38 in FIGS. 13(a) and 13(b) denotes an N-type high-concentration impurity layer formed by injection of the impurities.

The N-type high-concentration impurity layer 38 is disposed in the vicinity of the surface inside the base region 29 and ohmic region 33.

Figure 14A:
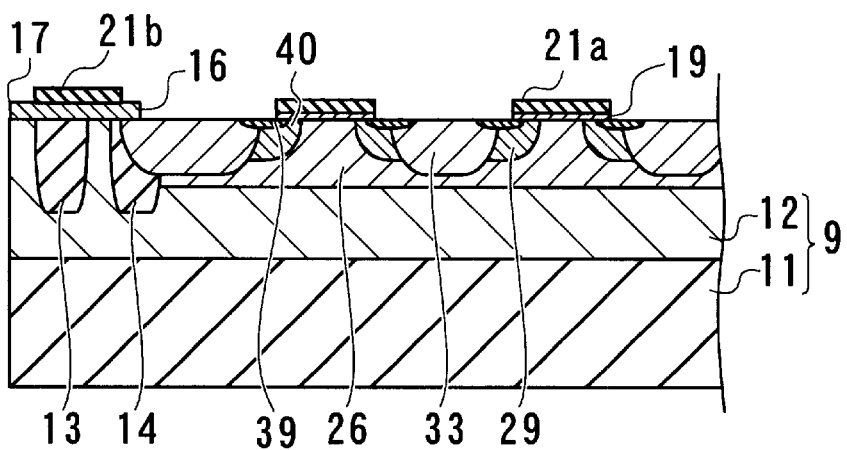
FIGS. 14(a) and 14(b) are views for illustrating the manufacturing process of the field effect transistor of the one example of the present invention.
Figure 14B:
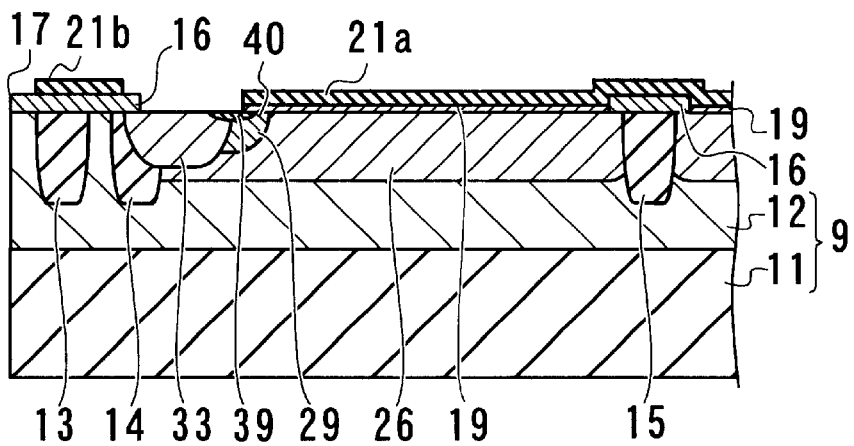

Then, after removing the resist film 35 therefrom, a thermal treatment is performed to diffuse the high-concentration impurity layer 38. As a result, an N-type source region 39 is formed as shown in FIGS. 14(a) and 14(b). The gate electrode film 21a on the gate insulation film 19 is so configured that the body portions $22_1$ and $22_2$, the connecting portion 23, and the branch portions 24 are connected to one another, and the N-type high-concentration impurity layer 38 is formed around the gate electrode film 21a. Accordingly, the source region 39 surrounds the gate insulation film 19 and the gate electrode film 21a disposed on the surface thereof so that the source region 39 is formed in a continuous ring as a whole. In this state, the central portion of the ohmic region 33 is exposed.

With the lateral diffusion, the end portion on the gate insulation film 19 side of the source region 39, i.e., the inner periphery end portion of the ring-shaped source region, extends to the underlying position of the gate insulation film 19, but stops at a position inner than the base region 29.

Therefore, the whole N-type source region 39 is situated inside the P-type region formed of the base region 29 and the ohmic region 33.

Between the inner periphery end portion of the source region 39 and the edge portion of the base region 29, there exists an outer periphery portion of the base region 29. On the surface thereof, the gate insulation film 19 and the gate electrode film 21a are disposed.

A reference numeral 40 denotes the base region 29 between the inner periphery end portion of the source region 39 and the edge portion of the base region 29. When the gate electrode film 21a is applied with a positive voltage, the surface of the part of the base region is inverted to N-type so that the source region 39 and the conductive layer 26 are electrically connected. Therefore, the region 40 is referred to as a channel region.

The channel region 40 is disposed along the edge portion of the gate electrode film 21a within the active region. Therefore, the channel region 40 has the form of a ring having a ruggedness conforming to the form of the gate electrode film 21a.

The conductive layer 26 in the portion surrounded by the channel region 40 is so configured that the respective underlying positions of the body portions $22_1$ and $22_2$, the connecting portion 23, and a plurality of the branch portions 24 of the gate electrode film 21a become its respective body portions, connecting portion, and branch portions similar in form to the body portions $22_1$ and $22_2$, the connecting portion 23, and the branch portions 24, respectively. However, the size thereof is smaller than that of the gate electrode film 21a by the amount of lateral diffusion of the channel region 40 into the underlying portion of the gate insulation film 19.

Then, a silicon dioxide film is formed on the substrate surface by a CVD method, and then patterned by etching to form an interlayer insulation film. A reference numeral 41 in FIGS. 15(a) and 15(b) denotes the interlayer insulation film, wherein three types of apertures 42a, 42b, and 42c are formed.

The apertures 42a, 42b, and 42c are separated from one another. The first aperture 42a is disposed within the active region inner than the field insulation film 16, and at the bottom thereof, the surface of the ohmic region 33 and the surface of the source region 39 are exposed.

The second aperture 42b is disposed on the gate electrode film 21b on the field insulation film 16, and at the bottom thereof, the surface of the gate electrode film 21b disposed on the field insulation film 16 is exposed.

With the third aperture 42c is partially disposed on the body portions $22_1$ and $22_2$, and at the bottom thereof, the surface of the gate electrode film 21a located within the active region is exposed.

Figure 16:
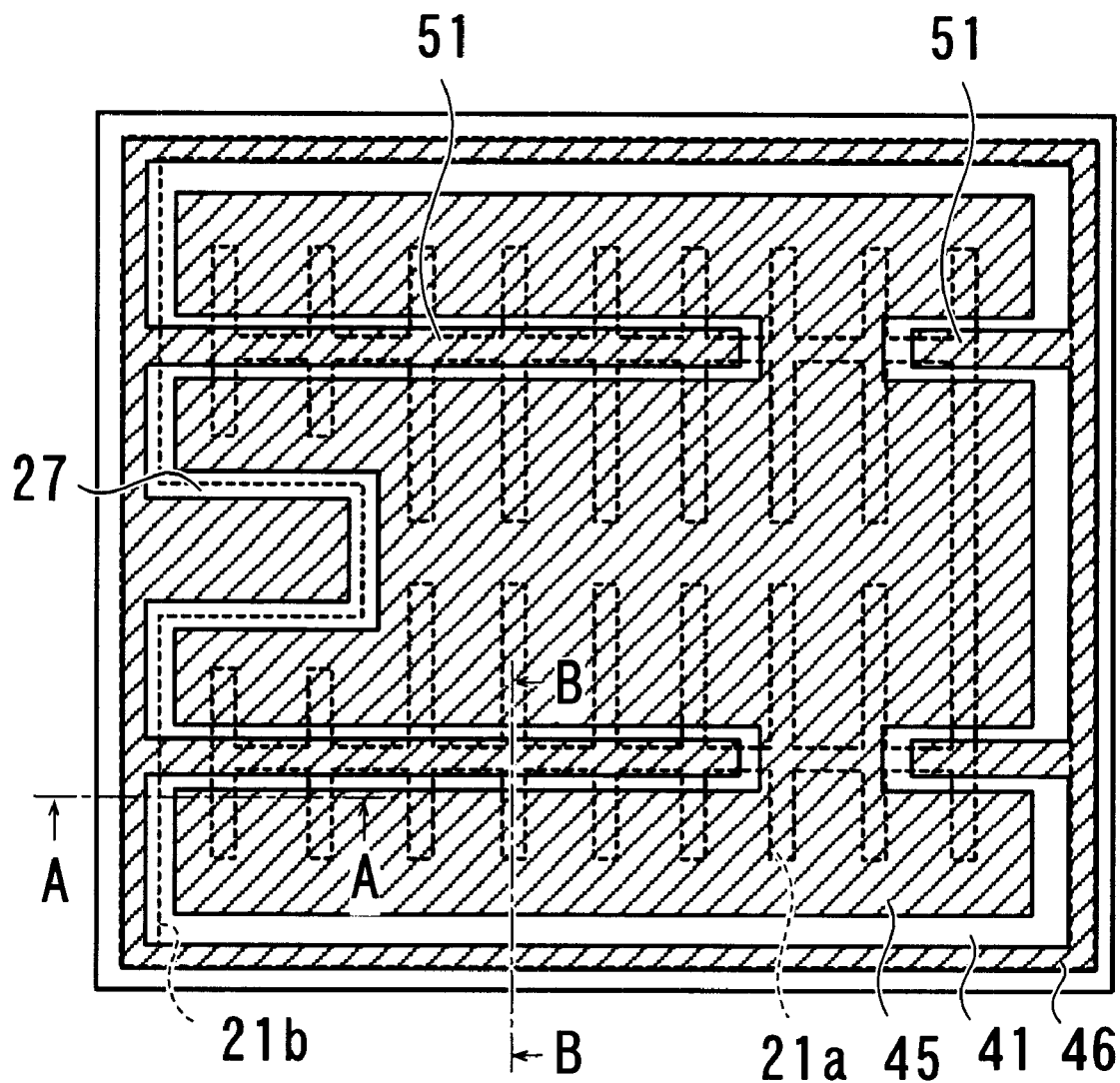
FIG. 16 is a view for illustrating the manufacturing process of the field effect transistor of the one example of the present invention.

Subsequently, on the entire surface of the substrate 9, an aluminum thin film is formed and patterned to form a source electrode film 45 and a gate connection film 46 as shown in FIG. 16. The source electrode film 45 and the gate connection film 46 have been separated from each other upon patterning to be electrically insulated from each other. The surface of the interlayer insulation film 41 is exposed between the source electrode film 45 and the gate connection film 46.

Figure 17A:
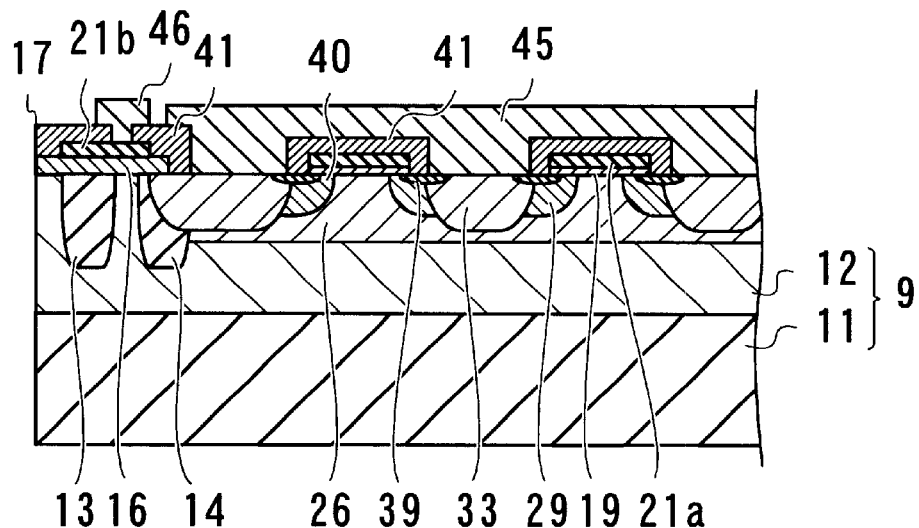
FIGS. 17(a) and 17(b) are cross sectional views of FIG. 16, for illustrating the manufacturing process of the field effect transistor of the one example of the present invention.
Figure 17B:
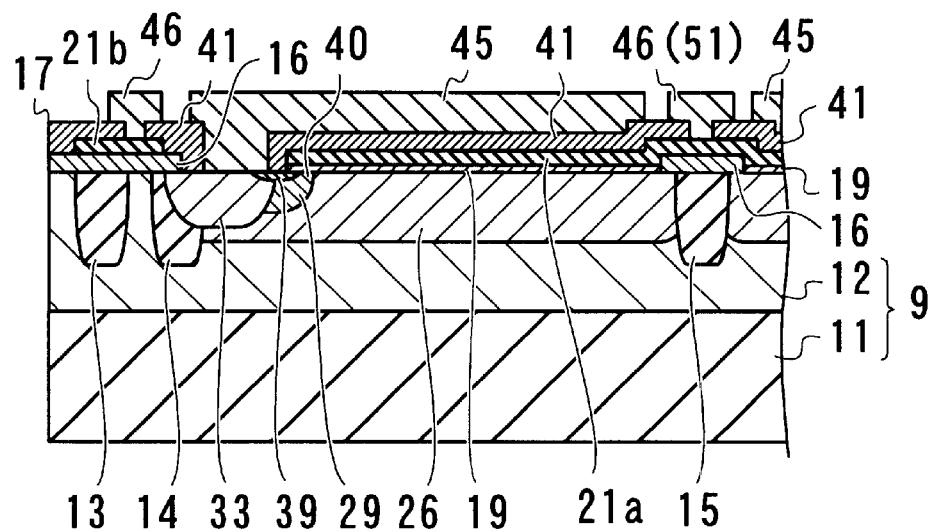

FIGS. 17(a) and 17(b) are cross-sectional views taken along the lines A—A and B—B of FIG. 16, respectively. As shown in FIGS. 17(a) and 17(b), the source electrode film 45 is connected to the ohmic region 33 and the source region 39. Therefore, the P-type main diffused region composed of the base region 29 including the channel region 40 and the ohmic region 33 and the N-type source region 39 are electrically short-circuited.

The source electrode film 45 is disposed so as to avoid contact with the third aperture 42c and the portion where the aperture 42c is situated is constrictedly formed. This configuration ensures that the source electrode film 45 is not in contact with the gate electrode film 21a.

The gate connection film 46 overhangs at the constricted portion, and is filled in the third aperture 42c. Accordingly, the gate connection film 46 is connected to the gate electrode film 21a at the positions of the body portions $22_1$ and $22_2$. A reference numeral 51 denotes the gate connection film 46 at the portion hanging over the body portions $22_1$ and $22_2$.

Further, the gate connection film 46 is also filled in the second aperture 42b, and also connected to the gate electrode film 21b located at the bottom thereof. Accordingly, connection is ensured between the gate electrode films 21a and 21b by the gate connection film 46.

The gate connection film 46 is formed with a large area on the pad portion 27 where the field insulation film 16 has been formed with a large area so that this portion is used as a gate pad.

Figure 18:
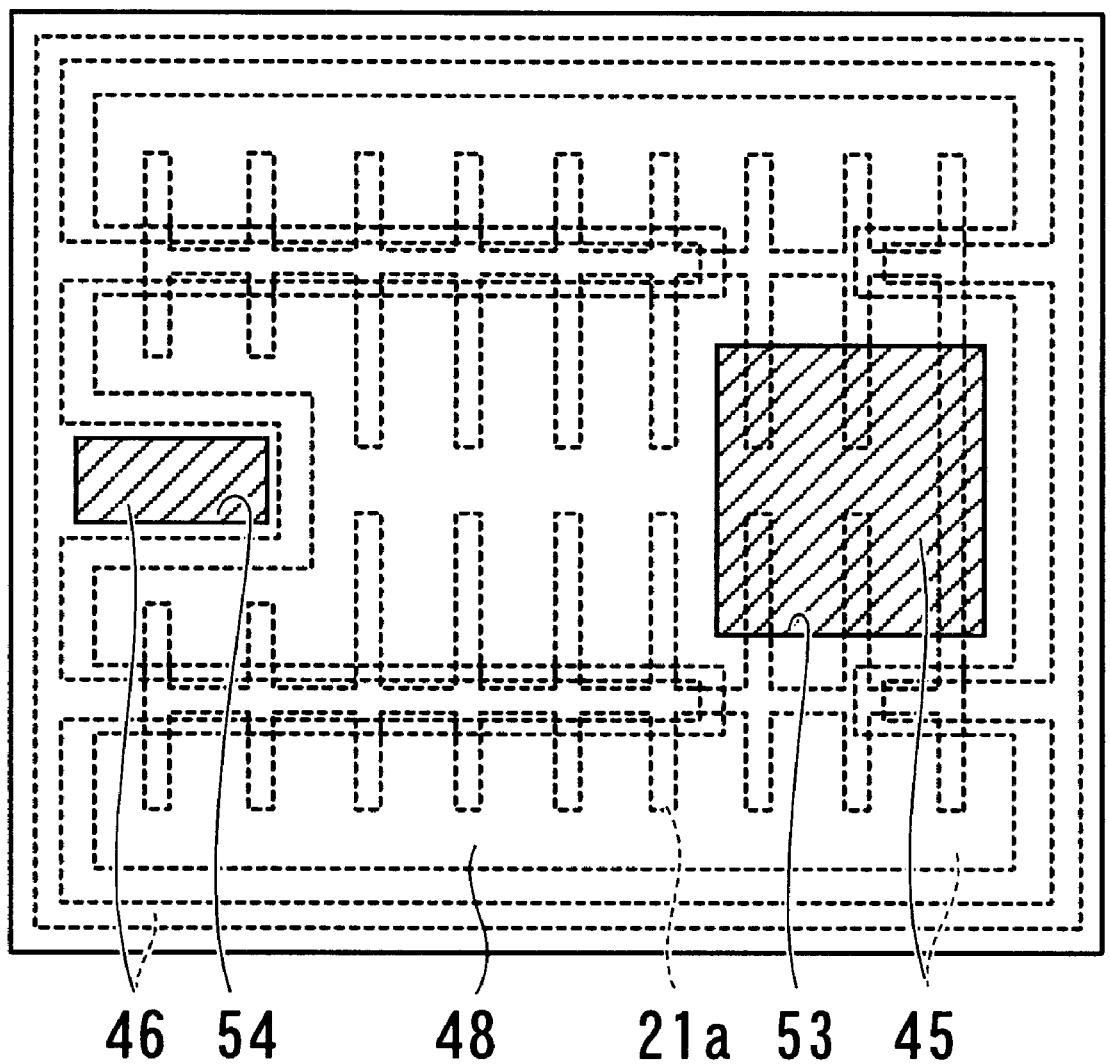
FIG. 18 is a view for illustrating the manufacturing process of the field effect transistor of the one example of the present invention.
Figure 19A:
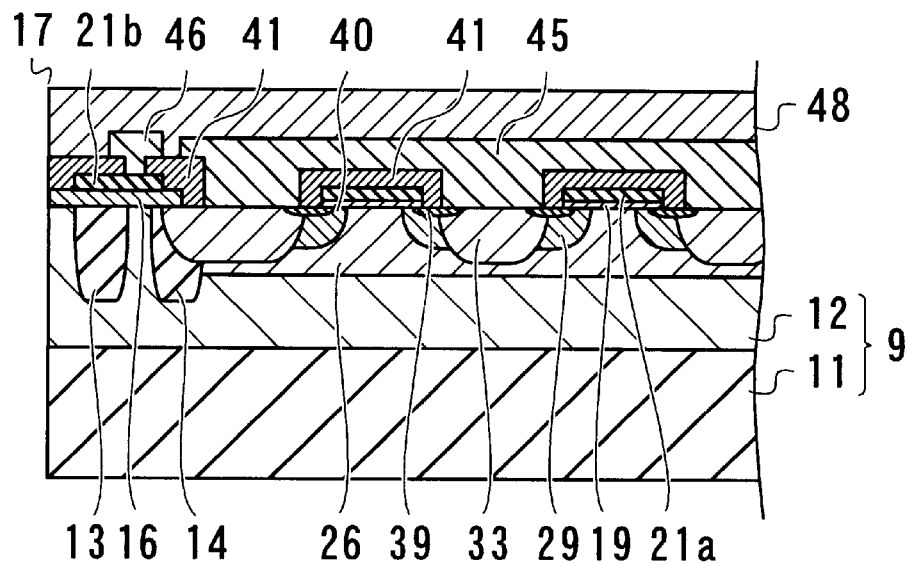
FIGS. 19(a) and 19(b) are cross sectional views of FIG. 18, for illustrating the manufacturing process of the field effect transistor of the one example of the present invention.
Figure 19B:
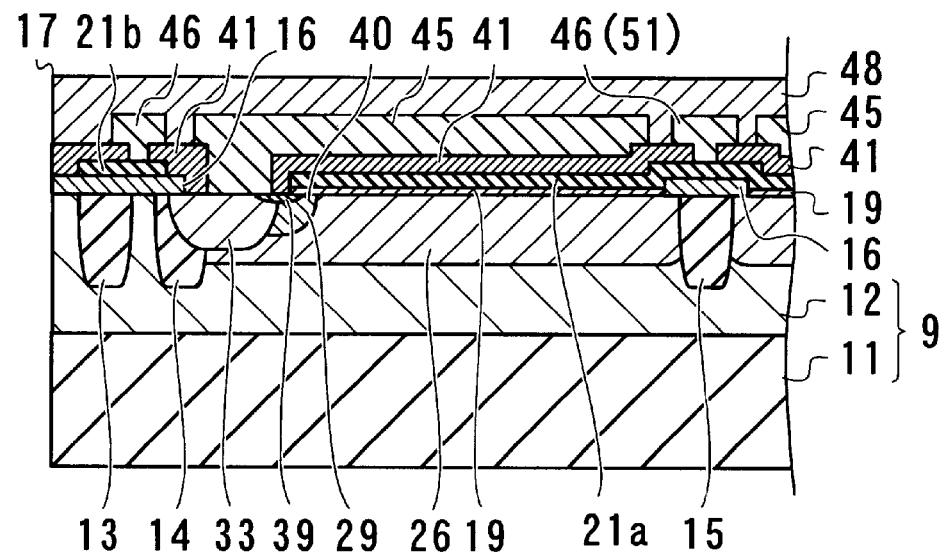

Then, a silicon dioxide thin film is formed by a CVD method on the surface (each surface of the source electrode film 45, the gate connection film 46, and the interlayer insulation film 41) of the substrate 9, and patterned to form a protective layer 48 as shown in FIG. 18 and FIGS. 19(a) and 19(b). The protective layer 48 has two apertures. The source electrode film 45 is exposed at the bottom of one aperture 53 to be taken as a source pad, while the surface of the gate connection film 46 is exposed at the bottom of the other aperture 54 to be taken as a gate pad. Thus, in the post process, respective one ends of metal fine wires are individually connected to the source pad and the gate pad, and respective other ends thereof are individually connected to leads so that the source electrode film 45 and the gate electrode film 21*a* can be connected to an external circuit.

After formation of the protective layer 48, on the surface of the low resistance layer 11 exposed on the back side of the substrate 9, a metal film for forming an ohmic junction with the low resistance layer 11 is formed to be taken as a drain electrode film 49 as shown in FIGS. 20(*a*) and 20(*b*). Consequently, a field effect transistor 1 of the present invention can be obtained.

A plurality of the field effect transistors 1 are formed in one silicon wafer. Each field effect transistor 1 is cut into chips in a dicing process which is the post process.

FIG. 21(*a*) shows the relative positional relationship among the source region 39, the channel region 40, and the conductive layer 26 of the field effect transistor 1 of the present invention. The portion surrounded by the channel region 40 is the drain region, and the floating potential region 15 is disposed at each underlying position of the body portions 22₁ and 22₂ as shown in FIG. 21(*b*).

With the field effect transistor 1, upon applying a positive voltage of equal to or greater than the threshold voltage to the gate electrode film 21*a* while the source electrode film 45 being set at a ground potential, and a positive voltage being applied to the drain electrode film 49, an N-type inversion layer is formed on the surface of the P-type channel region 40. Accordingly, the drain region and the source region 39 are connected to each other through the inversion layer, thereby rendering the field effect transistor 1 conducting.

When the gate electrode film 21*a* is set at a ground potential from the conduction state, the inversion layer disappears so that the field effect transistor 1 is cut off.

In the state where the source electrode film 45 is connected at a ground potential, and the drain electrode film 49 is applied with a positive voltage, the pn junction between the P-type main diffused region including the channel region 40, the base region 29, the ohmic region 33 and the second guard ring region 14, and the N-type conductive layer 26 and the high resistance layer 12 is reverse-biased so that the depletion layer extends toward the conductive layer 26. That is, the depletion layer extends toward the inside of the drain region surrounded by the channel region 40.

As described above, the floating potential region 15 is disposed at each of the underlying positions of the body portions 22₁ and 22₂ of the gate electrode film 21*a* as shown in FIG. 21(*b*). Both the end portions of the floating potential region 15 are not in contact with the channel region 40, and hence the floating potential region 15 is set at a floating potential.

The first guard ring region 13 is also set at a floating potential. The floating potential region 15 extends the depletion layer formed within the conductive layer 26 as the first guard ring region 13 extends the surface of the depletion layer formed within the high resistance layer 12, thereby improving the withstand voltage.

In the above example, as shown in FIGS. 3(*a*) to 3(*c*), the N-type impurities for forming the conductive layer 26 were injected into the entire substrate surface except for the portion on which the field insulation film 16 was disposed to form the high-concentration impurity layer 18. Then, the conductive layer 26 was formed by diffusion of the high-concentration impurity layer 18.

Therefore, with the field effect transistor 1 of the above example, the conductive layer 26 was disposed on the entire surface of the drain region inside the channel region 40. However, the field effect transistor of the present invention is not limited thereto, and the conductive region 26 can be disposed partially on the surface side of the inside of the drain region.

For example, by disposing patterned resist mask before injecting N-type high-concentration impurities and selectively injecting the impurities into the surface of the high resistance layer 12, an N-type high-concentration impurity layer 18 can be partially formed within the drain region annularly surrounded by the channel region 40.

Figure 22:
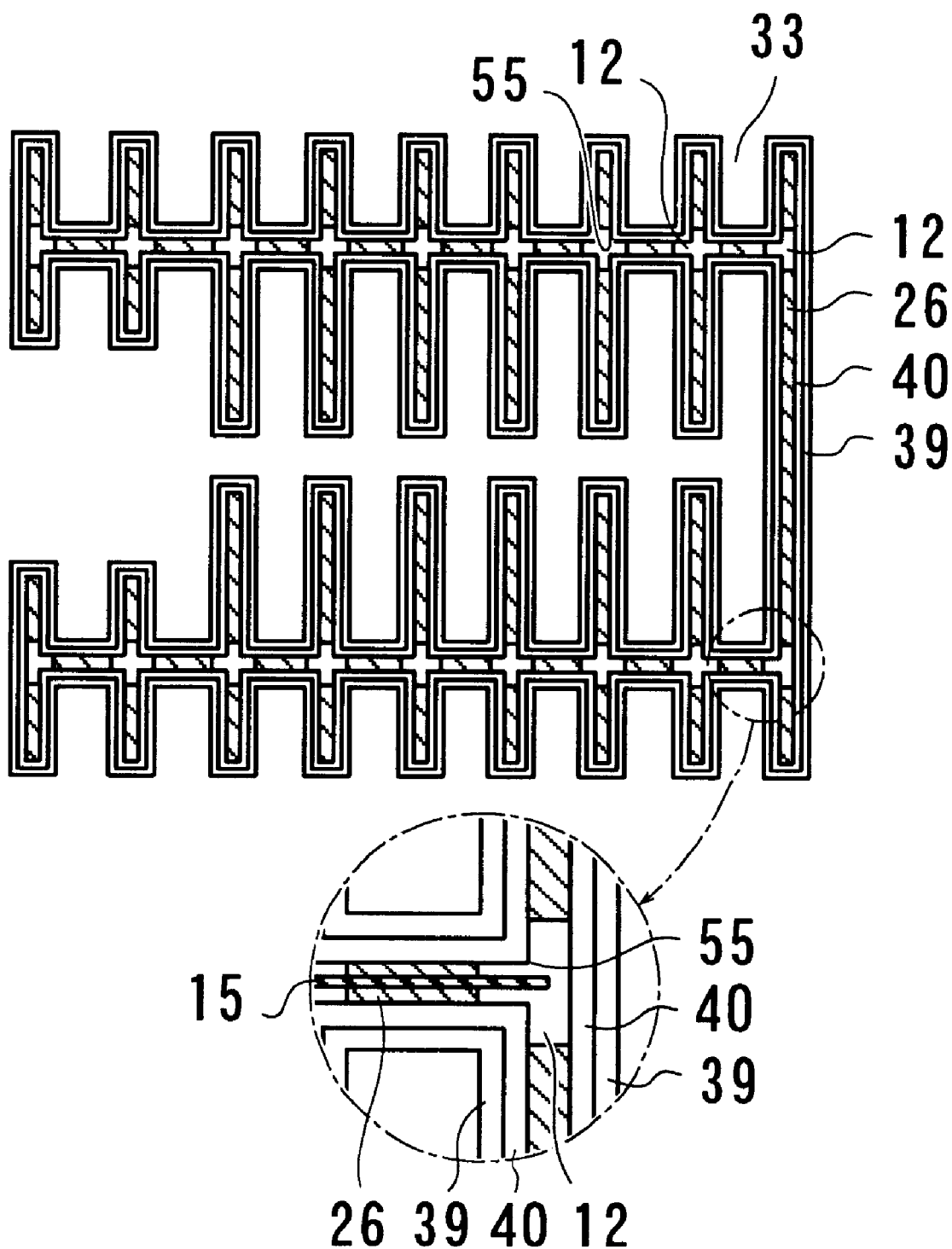
FIG. 22 is a view for illustrating the condition where the conductive layer has been partially formed within a drain region.

FIG. 22 is a view showing the positional relationship between the channel region 40 and the conductive region 26 in this case. In the vicinity of the corner portion 55 protruding toward the inside of the drain region, of the channel region 40, the conductive layer 26 is not disposed, and the surface of the high resistance layer 12 is exposed. Therefore, a PN junction is formed between the channel region 40 and the high resistance layer 12 at the corner portion 55. Accordingly, when the PN junction is reverse-biased, the depletion layer tends to extend from the corner portion 55 toward the inside of the high resistance layer 12. For this reason, the field effect transistor of this configuration has a higher withstand voltage.

Then, a field effect transistor with a still higher withstand voltage will be described.

Figure 23:
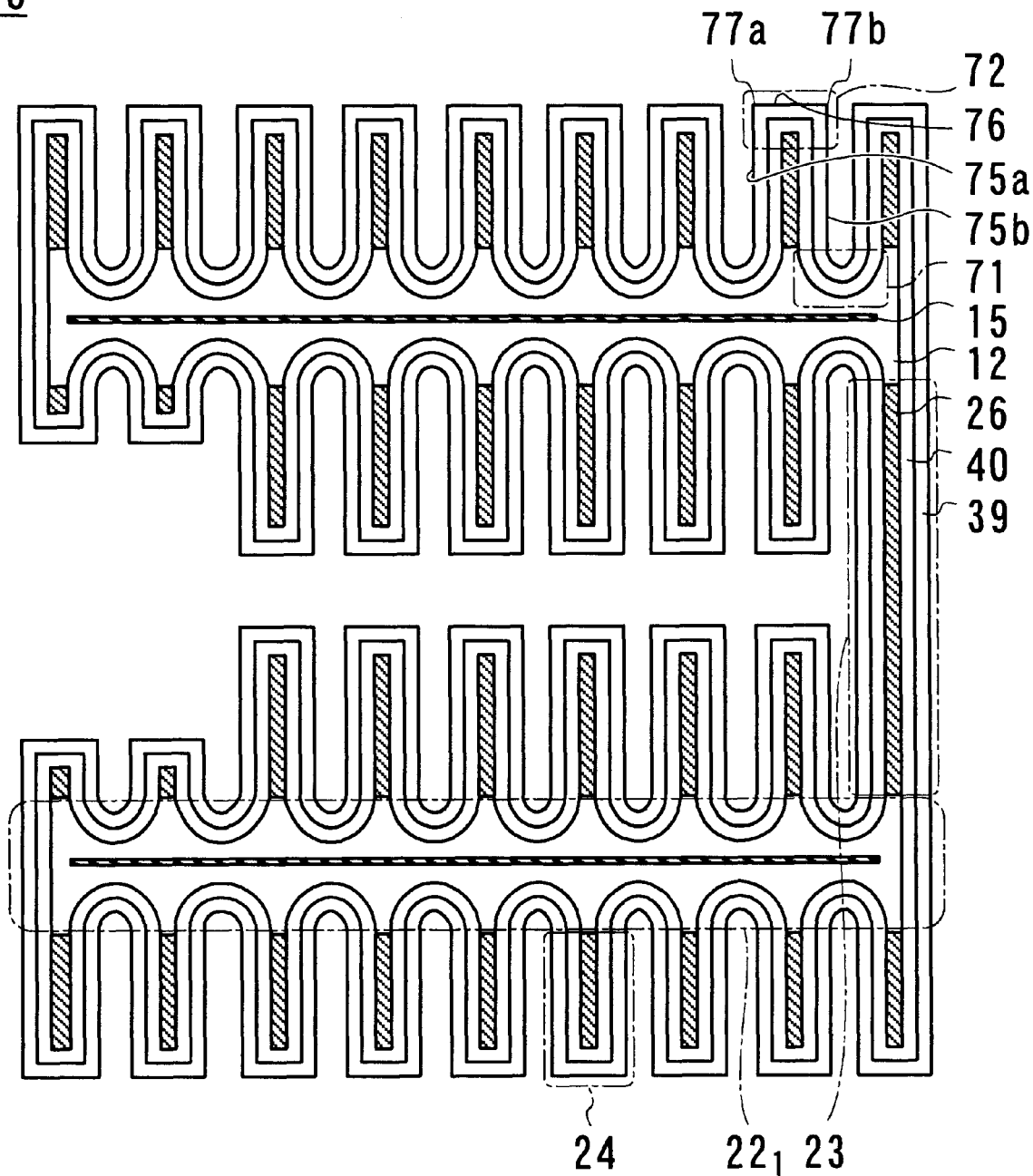
FIG. 23 is a view showing an example of the plan configuration of the channel region and a diffusion layer inside thereof of the field effect transistor of the present invention.

The field effect transistor and the foregoing field effect transistor 1 are identical in structure, but differs from each other in the plan configuration of the gate insulation film within the active region, and the gate electrode film as shown in FIG. 23.

Since each diffusion layer and each thin film are formed in the same process as the foregoing process, like elements and components are given like reference numerals. A reference numeral 70 denotes the plan configuration formed with the source region 39 and the channel region 40 for forming a double ring, the high resistance layer 12 surrounded by the channel region 40, the conductive layer 26, and the floating potential region 15.

The plan configuration of the portion surrounded by the channel region 40 in the N-type region formed with the high resistance layer 12 and the conductive layer 26 is comprised of two body portions 22₁ and 22₂, one connecting portion 23, and a plurality of branch portions 24 as in the forgoing example. Between branch portions 24 in the body portions 22₁ and 22₂, the channel region 40 protrudes toward the inside of the N-type region surrounded by the channel region 40 to form a swelling portion 71.

Therefore, the pn junction formed with the channel region 40 and the N-type region is curved more gently than with the spherical junction so that a higher withstand voltage than the avalanche breakdown voltage for the spherical junction can be obtained.

On the other hand, in a tip portion 72 of each branch portion 24, three sides 75*a*, 76, and 75*b* of the surface of the conductive layer 26 constituting the branch portion 24 meet at right angles. In other words, at the tip portion 72, the channel region 40 bends at right angles, and therefore, the surface portion of the pn junction formed with the channel region 40 and the conductive layer 26 also bends at right angles.

Since the depletion layer extends toward the inside of the conductive layer 26 in the tip portion 72, even in the portions of the two vertexes 77*a* and 77*b* formed of points of intersection of the three sides 75*a*, 76, and 75*b*, the avalanche breakdown voltage is also larger than that for the cylindrical junction. The conductive layer 26 is disposed from the tip portion 72 of each branch portion 24 to the vicinity of the swelling portion 71, but not disposed in the vicinity of the swelling portion 71. Therefore, since the pn junction is formed with the channel region 40 and the high resistance layer 12 in the swelling portion 71, the depletion layer tends to extend toward the high resistance layer 12 so that the avalanche breakdown voltage becomes higher.

Further, since the tip portion 72, protruding toward the inside of the region surrounded by the source region 39, of the branch portion 24 is not in semicircular form but in rectangular form in the plan configuration 70, the length of the channel 40 is longer than with the semicircular form, and the conduction resistance is lower.

Figure 24:
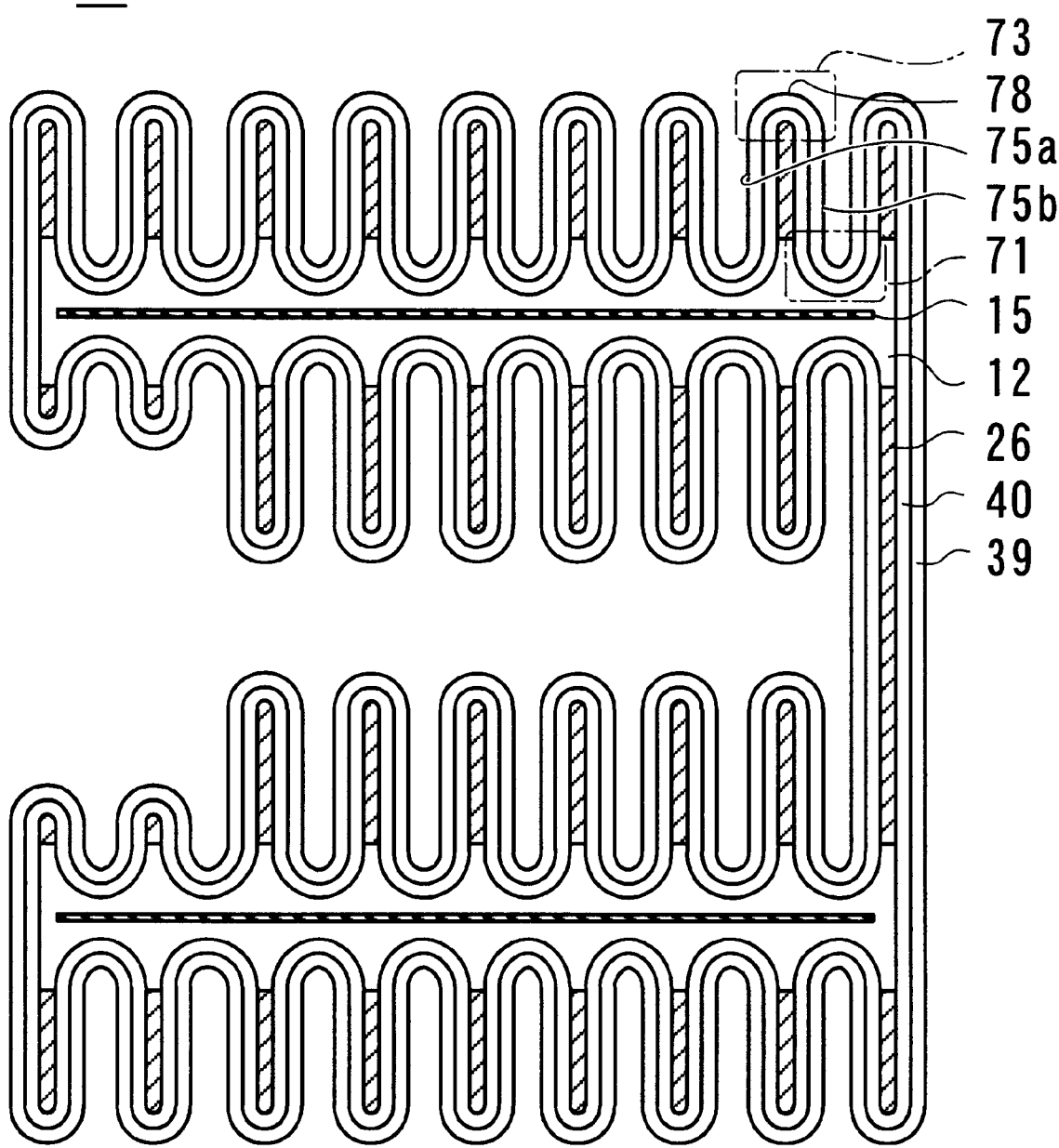
FIG. 24 is a view showing an example of the plan configuration of the channel region and the diffusion layer inside thereof of the field effect transistor of the present invention.

A reference numeral 80 in FIG. 24 denotes a plan configuration of the surface of substrate 9 omitted thin films such as a source electrode film, a gate electrode film, a silicon dioxide film when the tip of each branch portion 24 is formed in semicircular, and a reference numeral 73 denotes the circular portion thereof. When it is assumed that the radius of the circular portion 73 is R, the channel width of the circular portion 73 is π×R. In contrast, in the tip portion 72 of the plan configuration 70 of FIG. 23, the channel width is 4×R. Therefore, the tip of each branch portion 24 is advantageously in rectangular form.

In the above examples, the interval between the inner periphery of base region 29 and inner periphery of ohmic region 33 is uniform but the present invention is not limited by this condition. The field effect transistor of the present invention, for example, includes the field effect transistor having a structure where a part of the inner periphery of the ohmic region 33 extends beyond the inner periphery of the base region 32 and protrudes to the N-type region surrounded by the channel region 40.

Figure 28:
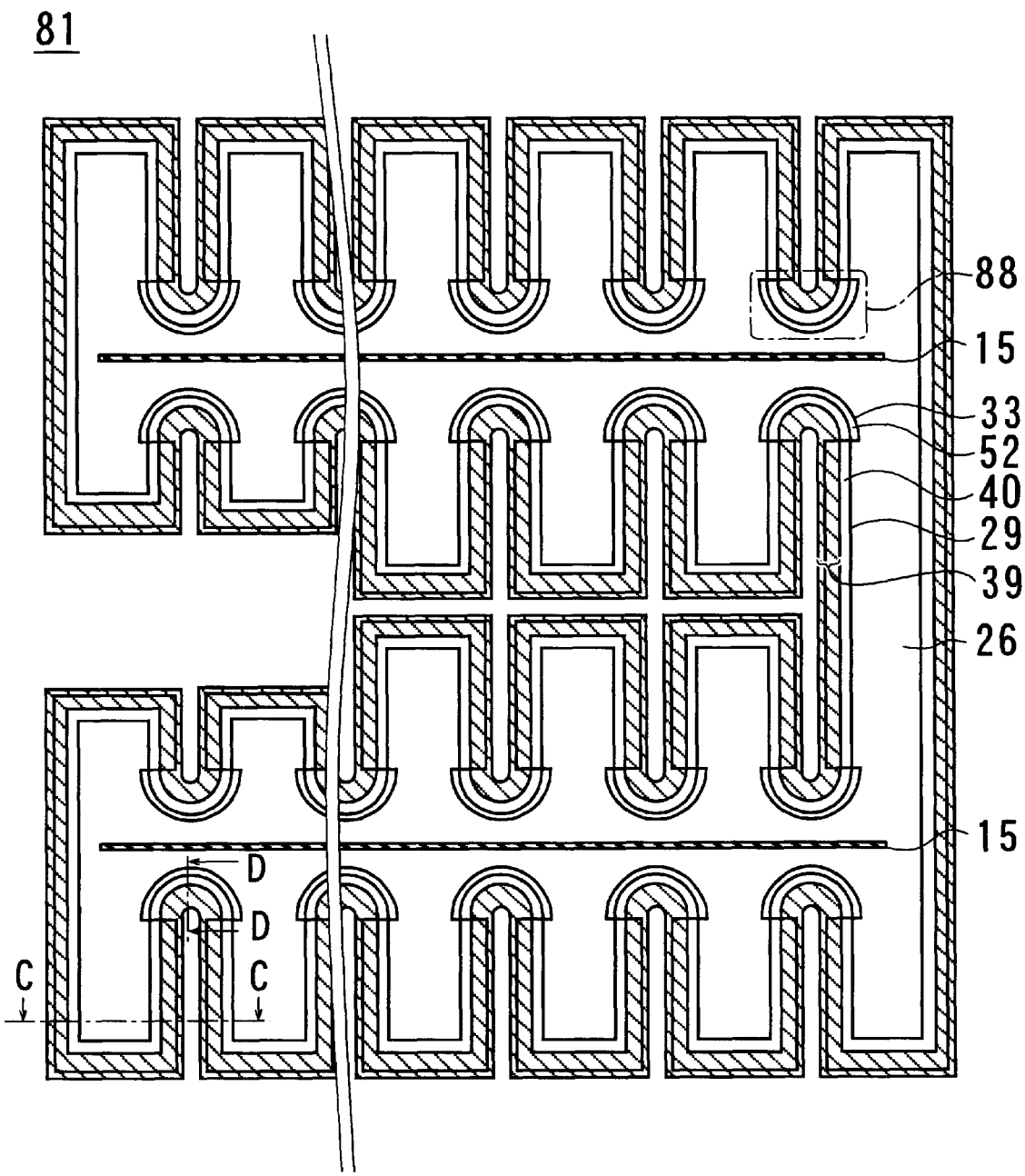
FIG. 28 is a view for illustrating a pattern among patterns of the field effect transistor of the present invention where a part of the ohmic region is extends toward inside of N-type region.

Reference numeral 81 of FIG. 28 denotes a view showing a plan configuration of one of the examples, and where thin films (such as, source electrode film, gate electrode film, silicon oxide film or the like), and the first and second guard ring regions 13, 14 are omitted.

Reference numerals of the diffusion layer and thin films are the same reference numerals used in the above examples because the structure in the direction of the depth of the substrate 9 is similar to that of each of the above examples except that the plan configuration of the ohmic region 33 is different.

Reference numeral 88 of FIG. 28 denotes a swelling portion extended into the inner side of the N-type region surrounded by the channel region 40. The swelling portion is formed in semicircular and the ohmic region 33, which is a part of the swelling portion 88 formed in semicircular, is formed wider than the other portion of the ohmic region 33. In other words, on this plan configuration, the ohmic region 33 located in the swelling portion 88 is more extended toward the inner side of the N-type region surrounded by the channel region 40 than the ohmic region 33 located between the straight portions of the branch portion 24, and the edge of the ohmic portion 33 of the swelling portion 88 extends toward the inner side of the N-type region at least beyond the inner periphery of the source region 39.

The configuration of part excluding the swelling portion 88 is the same as that of the field effect transistor 1 of the first example. Therefore, the figure illustrating the manufacturing process of a cross-sectional part along the line C—C of the branch portion 24 comprising the plan configuration 81 is the same figure illustrating the manufacturing process of a cross-sectional part along the line A—A in, for example, FIG. 1 and FIG. 2.

Figure 34A:
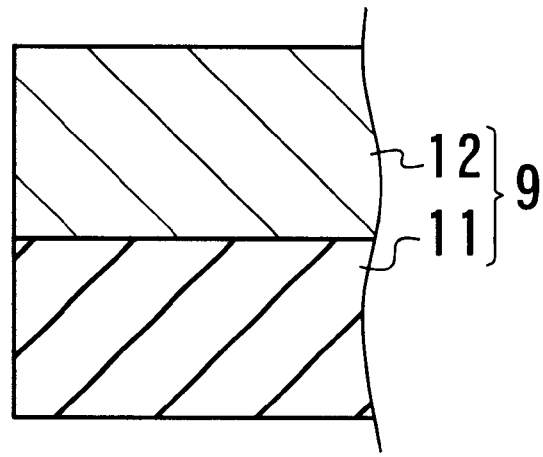
FIGS. 34(a) to 34(c) are views for illustrating a manufacturing process of the field effect transistor wherin a part of the ohmic region extends toward inside of N-type region.

The process of forming the plan configuration 81 is as follows. First of all, cross section of the first and second P-type guard ring regions 13, 14 formed in the high resistance layer 12 of the substrate 9 at the surface side along the line C—C is shown in FIG. 1(b) and that along the line D—D is shown in FIG. 34(a). In this state, a floating potential region 15 is formed at the part corresponding to the part shown in FIG. 1(c).

From FIG. 34 to FIG. 39 are process charts to explain the part corresponding to a cross-sectional view taken along the line D—D.

Figure 34B:
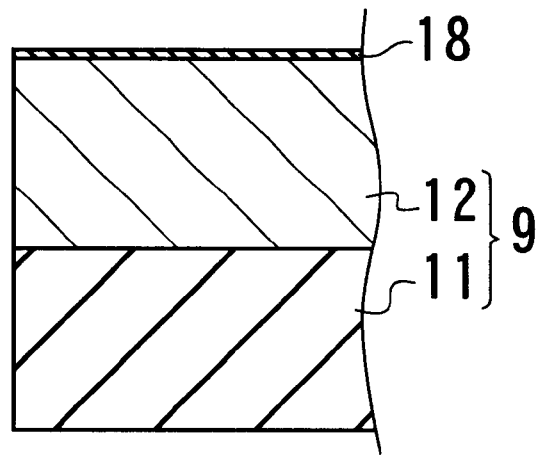
Figure 34C:
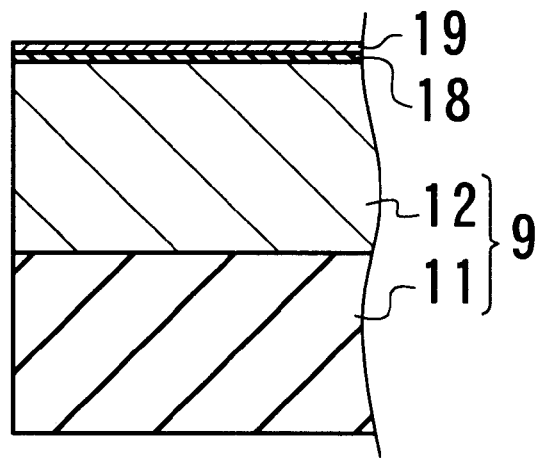

After the state described above is obtained, the N-type high concentration impurity layer 18 is formed in the vicinity of surface in the high resistance layer 12 as shown in FIG. 2(b) and FIG. 34(b), and the gate insulation film 19 is formed by the thermal oxidation method as shown in FIG. 3(b) and FIG. 34(c).

Figure 4B:
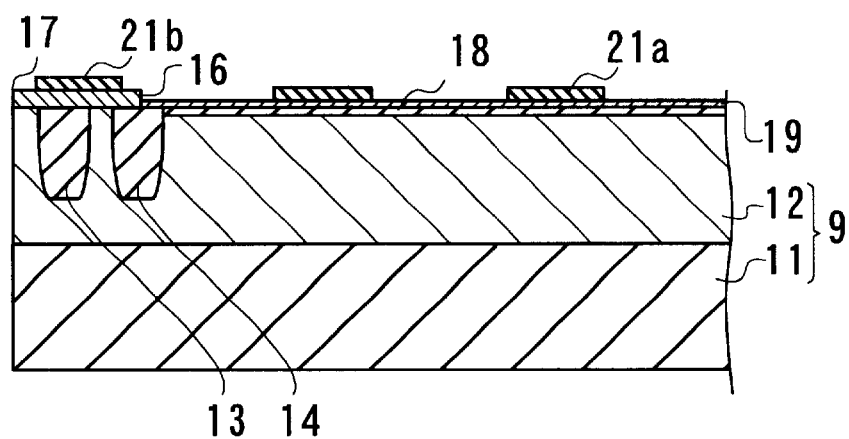
Figure 4C:
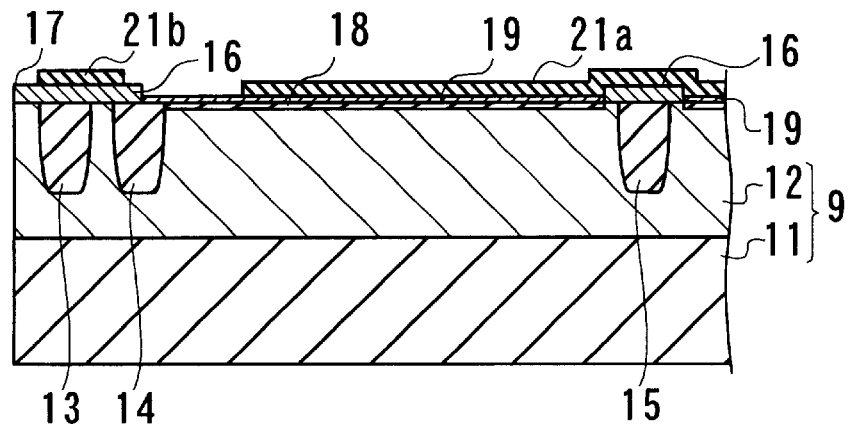
Figure 35A:
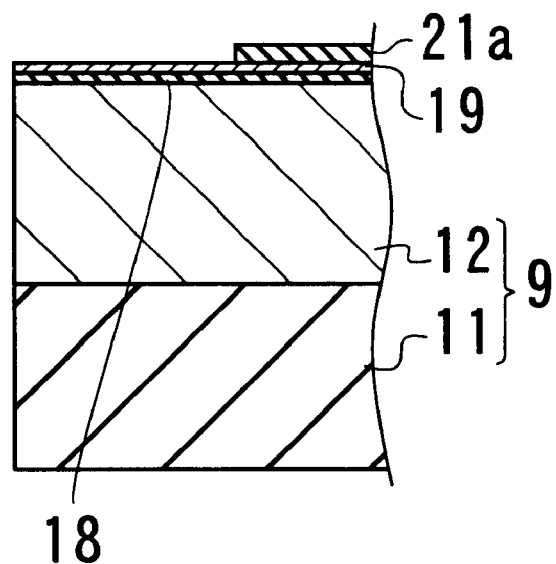
FIGS. 35(a) to 35(c) are views for illustrating the subsequent process.
Figure 35B:
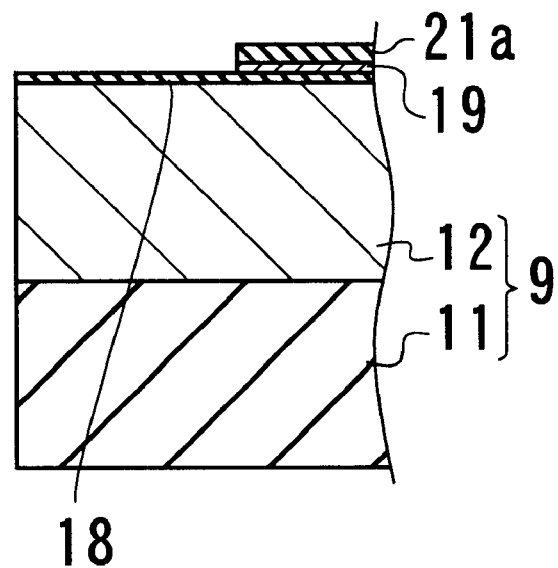
Figure 35C:
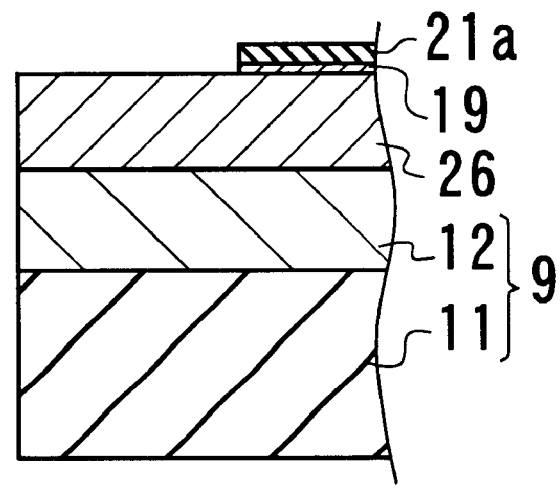

Next, gate electrode films 21a and 21b consisting of patterned polysilicon thin film are formed on the surface of the gate insulation film 19 as shown in FIG. 4(b) and FIG. 35(a), and then, after etching the gate insulation film 19 using the gate electrode films 21a and 21b as masks as shown in FIG. 5(a) and FIG. 35(b), the high concentration impurity layer 18 is diffused and the N-type conductive layer 26 is formed as shown in FIG. 6(a) and FIG. 35(c). The depth of the conductive layer 26 is made thinner than the depths of the first and second guard ring regions 13, 14 as in each of the examples.

Figure 36A:
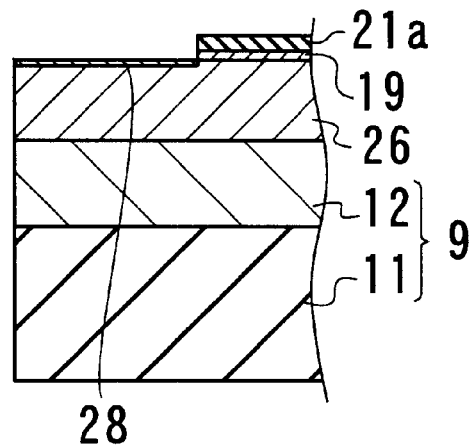
FIGS. 36(a) to 36(c) are views for illustrating the subsequent process.
Figure 36B:
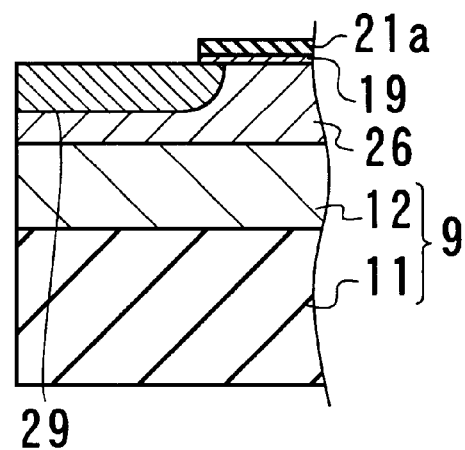

Next, using the gate electrode films 21a and 21b as masks, P-type impurities are injected and after forming the P-type high concentration impurity layer 28 in the conductive layer 26 in the vicinity of the surface, the P-type high concentration impurity layer 28 is diffused as shown in FIG. 7(a) and FIG. 36(a), and the P-type base region 29 is formed as shown in FIG. 8(a) and FIG. 36(b).

Figure 36C:
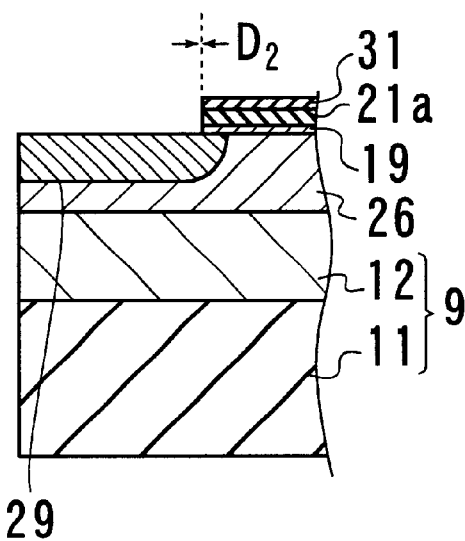

Next, as shown in FIG. 9(b) and FIG. 36(c), the patterned resist film 31 is formed on the gate electrode films 21a and 21b. During this process, in the part that is going to be the swelling portion 88, the resist film 31 is arranged only on the gate electrode film 21a so that the resist film 31 does not spread onto the base region 29 exposed beside the gate electrode film 21a.

In the first example described above, a region on the base region 29 begins from the edge of the gate electrode film 21a and ends at the position apart by a distance $D_1$ which is the width of the resist film 31 the base region 29 from the edge of the gate electrode film 21a is covered with the resist film 31 on the base region.

Figure 37A:
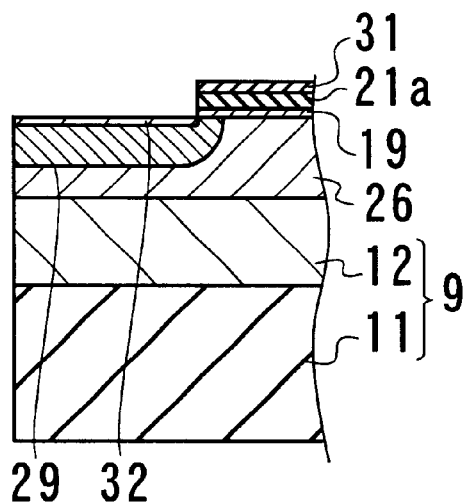
FIGS. 37(a) to 37(c) are views for illustrating the subsequent process.
Figure 37B:
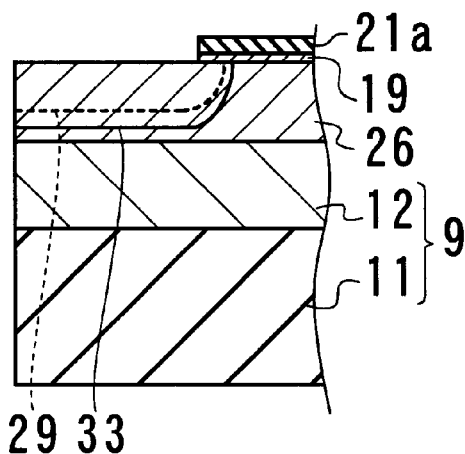

In this state, P-type impurities are injected into the base region 29 in order to form the P-type high concentration impurity layer 32 in the base region 29 at the vicinity of the surface as shown in FIG. 10(b) and FIG. 37(a), and then, by diffusing the P-type impurities after the resist film 31 is removed, ohmic region 33 is formed as shown in FIG. 11(a) and FIG. 37(b).

By lateral diffusion of the ohmic region 33, the edge of the ohmic region 33 extends to the underlying position of the gate insulation film 19 which is located under the gate electrode film 21a. In the example 1 described above, since the edge of the P-type high concentration impurity layer 32 is apart from the edge of the gate insulation film 19 by a distance $D_1$ which is the width of the resist film on the base region 29, the edge of the ohmic region 33 extends into the underlying position of the gate insulation film 19 for the distance corresponding to the lateral diffusion distance subtracted by the distance $D_1$.

On the other hand, in the swelling portion 88, width $D_2$ of the resist film on the base region 29 is narrower than $D_1$ described above and nearly equal to zero so that the edge of the ohmic region 33 extends into the underlying position of the gate insulation film 19 for the lateral diffusion distance.

In this state, the ohmic region 33 and the base region 29 are connected to each other and one comb-shaped patterned main diffused region is formed.

Figure 37C:
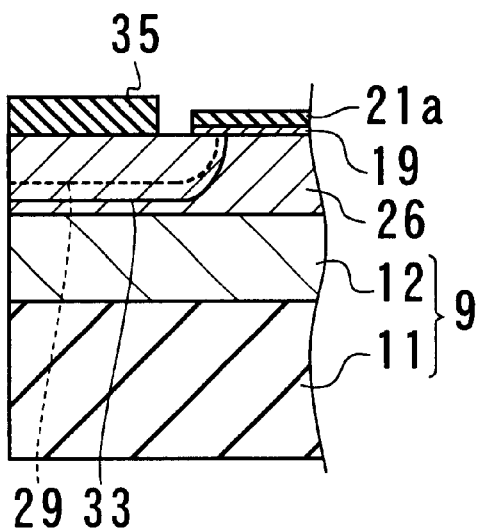

After this state is obtained, the patterned resist film is formed on the surface of the ohmic region 33 as shown in FIG. 12(b) and FIG. 37(c). The edge of the resist film 35 is apart from the edge of the gate electrode film 21a by a predetermined distance, and the surface of the ohmic region 33 or the base region 29 is exposed between the edge of the resist film 35 and the gate electrode film 21a.

Figure 13A:
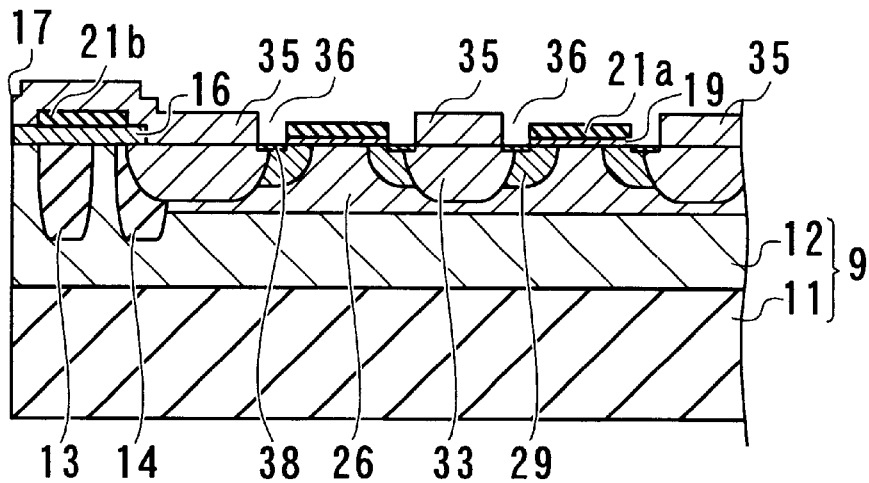
FIGS. 13(a) and 13(b) are views for illustrating the manufacturing process of the field effect transistor of the one example of the present invention.
Figure 13B:
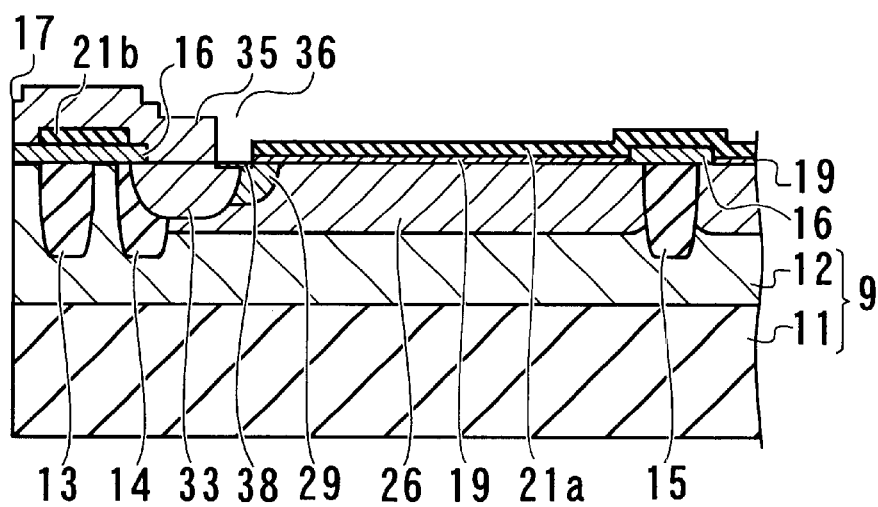
Figure 38A:
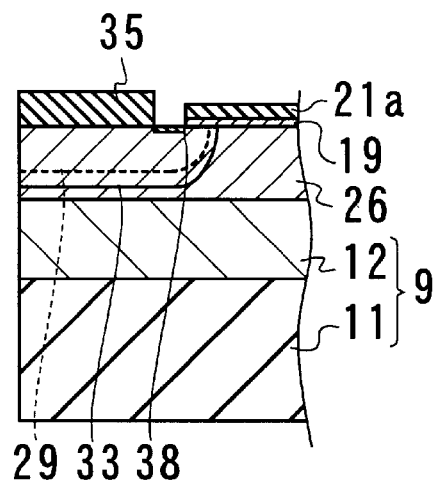
FIGS. 38(a) to 38(c) are views for illustrating the subsequent process.
Figure 38B:
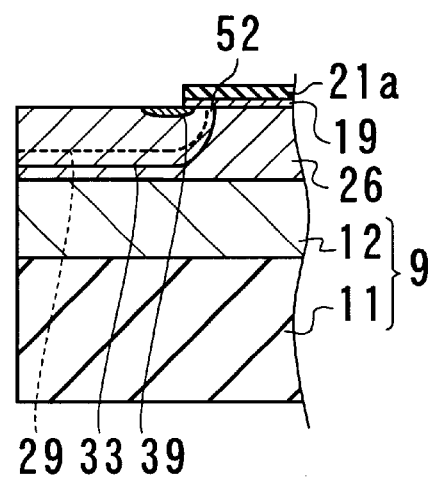

N-type impurities are then injected to form the N-type high concentration impurity layer 38 between the resist film 35 and the gate electrode film 21a as shown in FIG. 13(a) and FIG. 38(a), and the N-type impurities are diffused after the resist film 35 is removed to form the source region 39 in the P-type region consisting of the ohmic region 33 and the base region 29 as shown in FIG. 14(a) and FIG. 38(b).

This source region 39 has a comb-type ring shape along the inner periphery of the gate electrode film 21a. The inner periphery of the source region 39, having a ring shape, extends to the underlying position of the gate insulation film 19 under the gate electrode film 21a.

Additionally, in the body portions $22_1$ and $22_2$, the connection part 23, and the branch part 24 excluding the swelling portion 88, the base region 29 is located inside the inner edge of the source region 39 at the vicinity of the surface inside the substrate 9, and a region between the inner edge of the source region 39 and the inner edge of the base region 29 is the channel region 40.

In the swelling portion 88, on the substrate 9 being inner side of the inner edge of the source region 39 in the vicinity of the surface, the ohmic region 33 is diffused in the lateral beyond the inner periphery of the base region 29. Therefore, in the swelling portion 88, the ohmic region 33 exists at the vicinity of the surface inside the substrate 9 between the inner edge of the P-type region consisting of the ohmic region 33 and the base region 29 and the inner edge of the source region 39.

Reference numeral 52 indicates the channel region consisting of the part in the vicinity of the surface inside the ohmic region 33 between the inner periphery of the source region 39 of the swelling portion 88 and the inner periphery of the ohmic region 33. When the surface of the channel region 52 inverts to the N-type, the source region 39 and N-type conductive layer 26 surrounded by the channel region 40 and 52 are connected to each other through an inversion layer on the swelling portion 88. On the channel region 52 of the swelling portion 88, ohmic region 33 and channel region 29 are deposited at least partially overlapped, but it is possible to ignore surface concentration of the base region 29 because the surface concentration of the ohmic region 33 is higher than that of the base region 29. Therefore, threshold voltage of the channel region 52 of the swelling portion 88 is determined by surface concentration of the laterally diffused portion of the ohmic region 33 and the threshold voltage of the channel region 52 of the swelling portion 88 is higher than the threshold voltage of the other portion of the channel region 40, which is determined by surface concentration of the laterally diffused portion of the base region 29.

Figure 29:
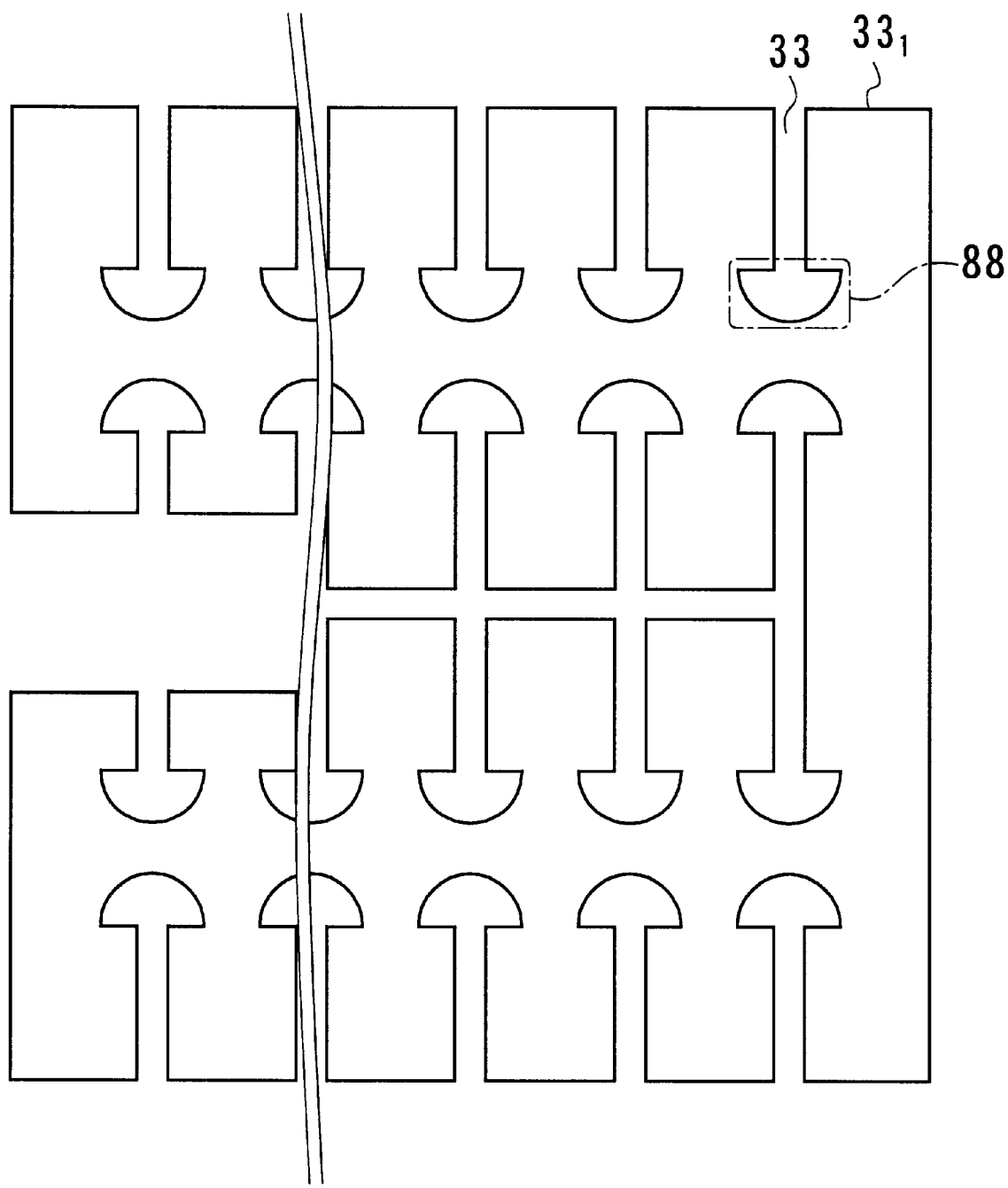
FIG. 29 is a view for illustrating the ohmic region in the pattern.
Figure 30:
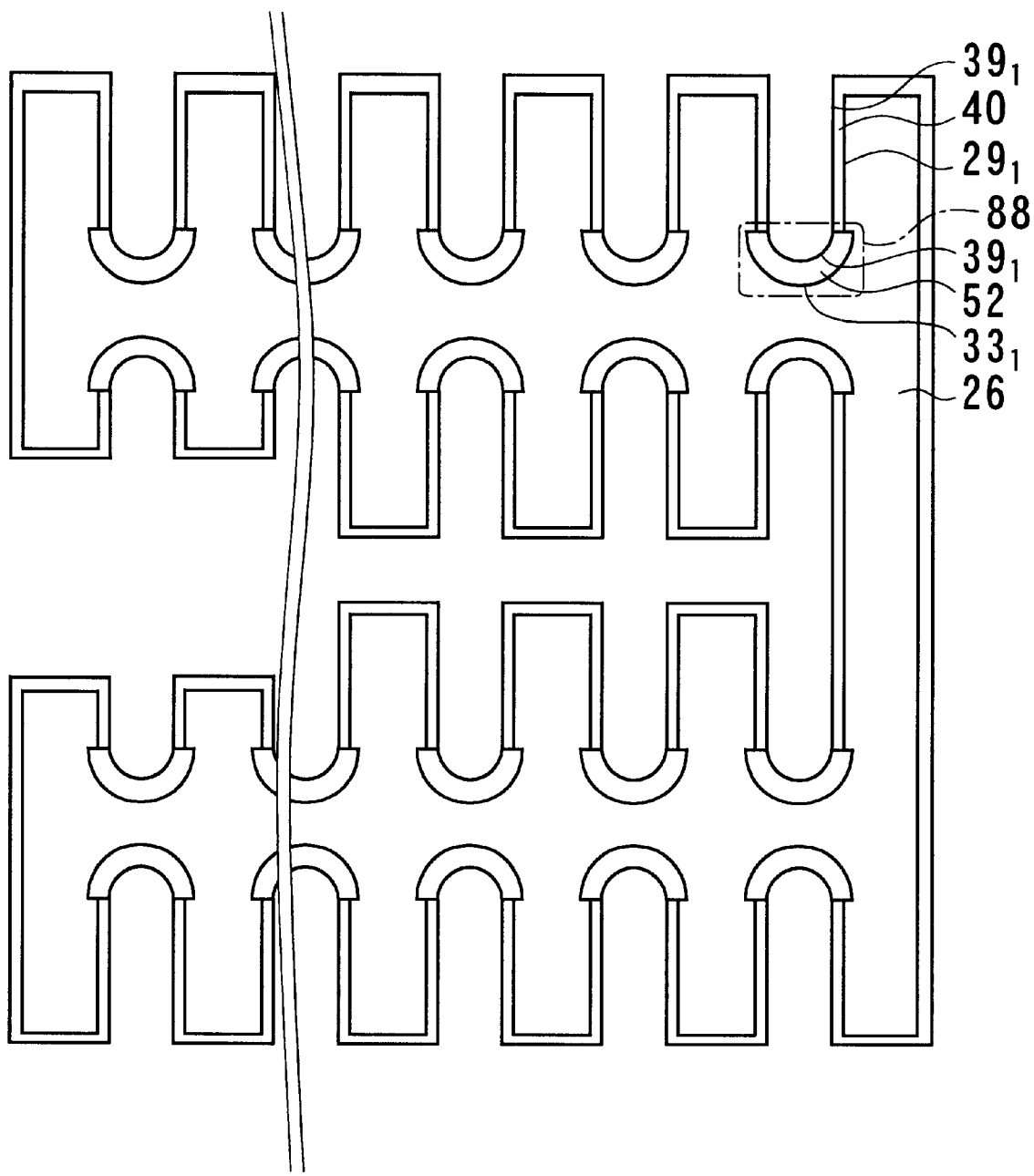
FIG. 30 is a view for illustrating the channel region in the pattern.
Figure 31:
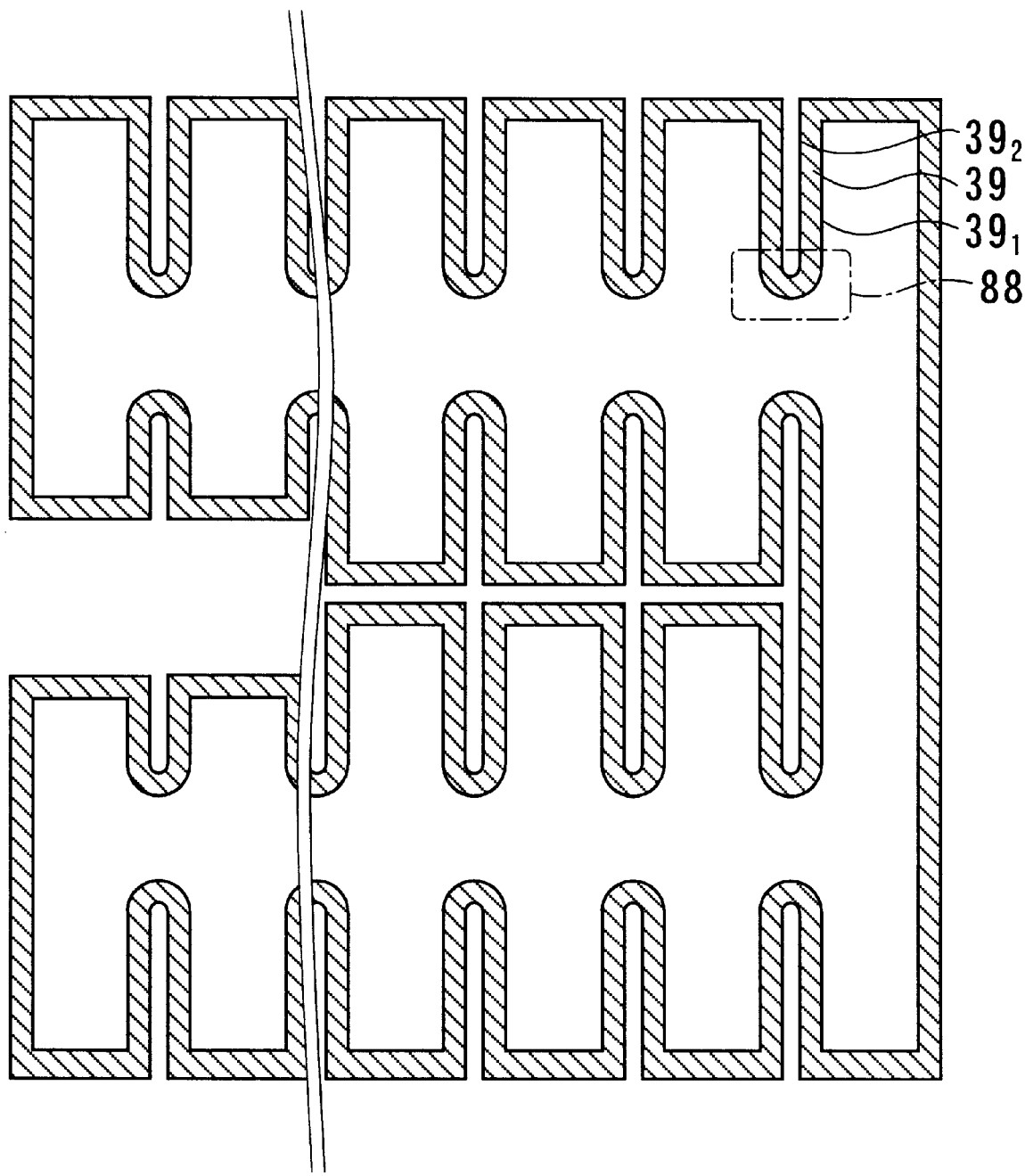
FIG. 31 is a view for illustrating the source region in the pattern.

FIG. 29 is a view showing the form of the ohmic region 33 and reference numeral 331 indicates an inner periphery of the ohmic region 33. FIG. 30 is a view showing the plan configuration and the positional relationship between the channel regions 40 and 52, and FIG. 31 is a view showing the plan configuration of the source region 39. Reference numerals $39_1$ and $39_2$ indicate the inner periphery of and the outer periphery of the surface of the source region 39 respectively and reference numeral $29_1$ indicates the inner periphery of the base region 29 surface.

The channel region 40 formed by the portion in the vicinity of the surface of the base region 29 is defined by the inner periphery $39_1$ of the source region 39 and the inner periphery $29_1$ of the base region 29, and the channel region 52 formed in the vicinity of the surface of the ohmic region 33 is defined by the inner periphery $33_1$ of the ohmic region 33 of the swelling portion 88 and the inner periphery $39_1$ of the source region 39.

The two kinds of channel regions 40 and 52 are continuous along the inner periphery $39_1$ of the source region 39 and the two kinds of channel regions 40 and 52 form a comb-type ring shape region.

Figure 15A:
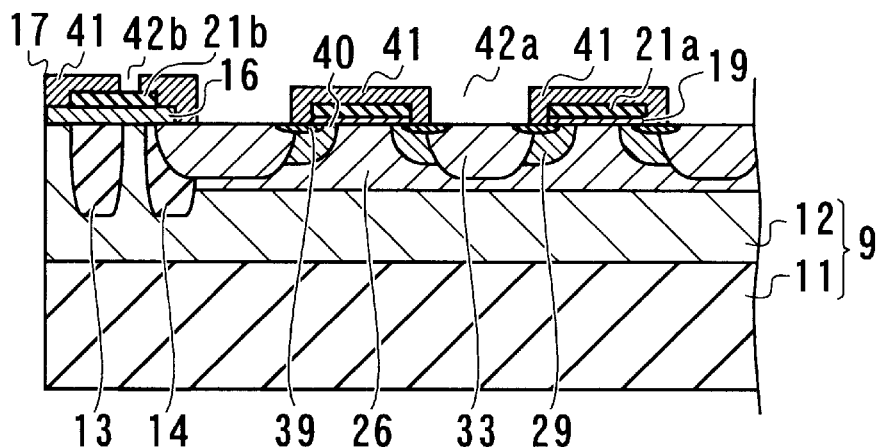
FIGS. 15(a) and 15(b) are views for illustrating the manufacturing process of the field effect transistor of the one example of the present invention.
Figure 15B:
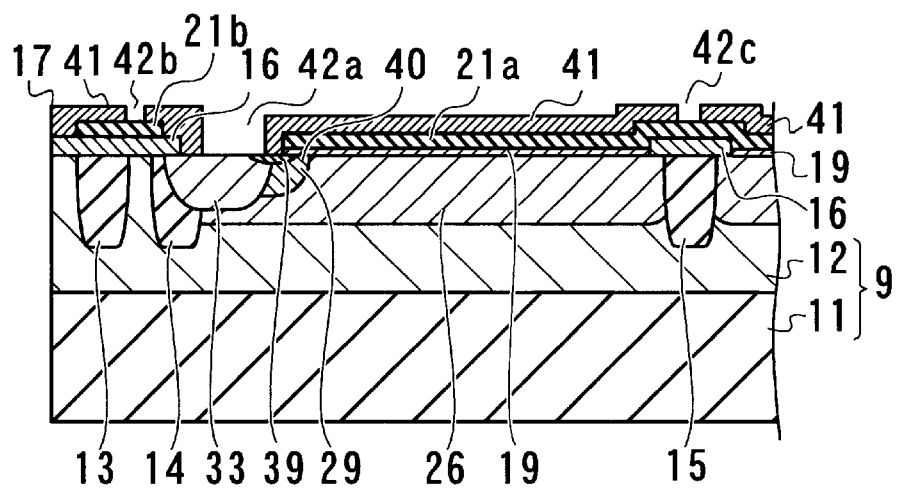
Figure 38C:
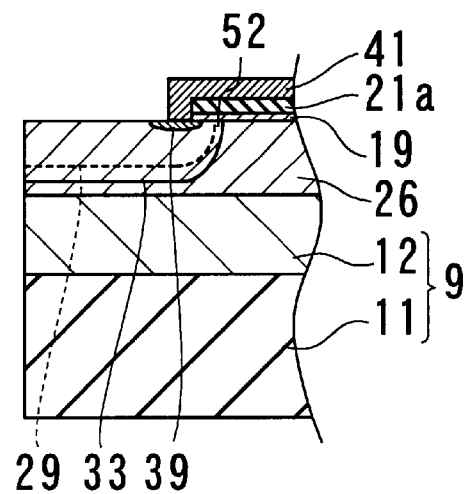
Figure 39A:
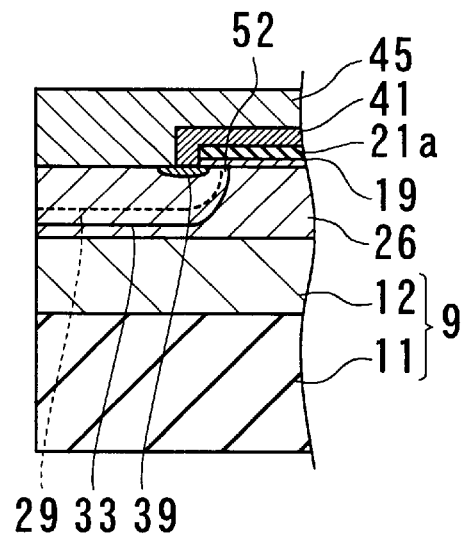
FIGS. 39(a) to 39(c) are views for illustrating the subsequent process.
Figure 39B:
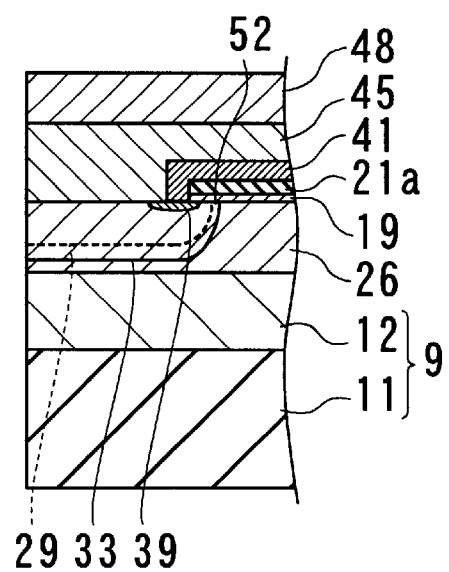
Figure 39C:
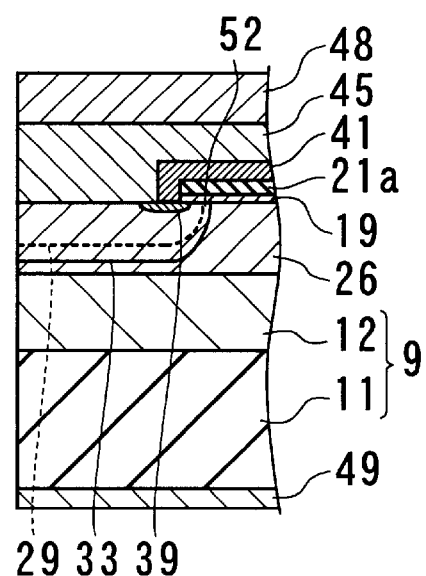

As described above, after forming the source region 39, interlayer insulation film is formed on the surface and then the interlayer insulation film is patterned so that the part in the vicinity of the inner periphery $39_1$ of the source region 39 and the ohmic region 33 surrounded by the inner periphery $39_1$ are exposed as shown in FIG. 15(a) and FIG. 38(c). The reference numeral 41 of those figures denotes the interlayer insulation film under the state described above.

Then, patterned source electrode 45 and protective layer 48, and a drain electrode film 49 on the back side of the substrate 9 are formed as shown in FIGS. 17(a), 19(a), 20(a) and 39(a) to 39(c), to obtain a field effect transistor 5 of the present invention.

In the field effect transistor 5, a conductive layer 26 is arranged all over the portion inside of the channel regions 40, 52, and a pn junction located in a swelling portion 88 is formed by the ohmic region 33 and a conductive region 26.

The diffusion depth of the ohmic region 33 is more than that of the base region 29 and the withstand voltage of the swelling portion 88 is as high as that of the other part. The withstand voltage becomes higher, when the conductive region 26 is not arranged around the swelling portion 88, but the withstand voltage does not become remarkably low by the swelling portion 88, even though the conductive region 26 is arranged all over the portion inside of the channel regions 40, 52. Therefore, when N-type impurities are injected to form the conductive region 26, resist film is not required to be arranged on the surface of the part to become the channel regions 40, 52 so that the number of steps of the photo process can be reduced by one compared to that of the photo process to form plan configuration 70, 80 of FIGS. 23, 24.

The swelling portion 88 is formed in semicircular, but the channel region 52 consisting of the portion in the vicinity of the surface of the ohmic region 33 may be formed by gradually extending the part of the ohmic region 33 having the branch portion 24 and the body portions 221, 222, or the straight part of the connecting portion 23.

Figure 32:
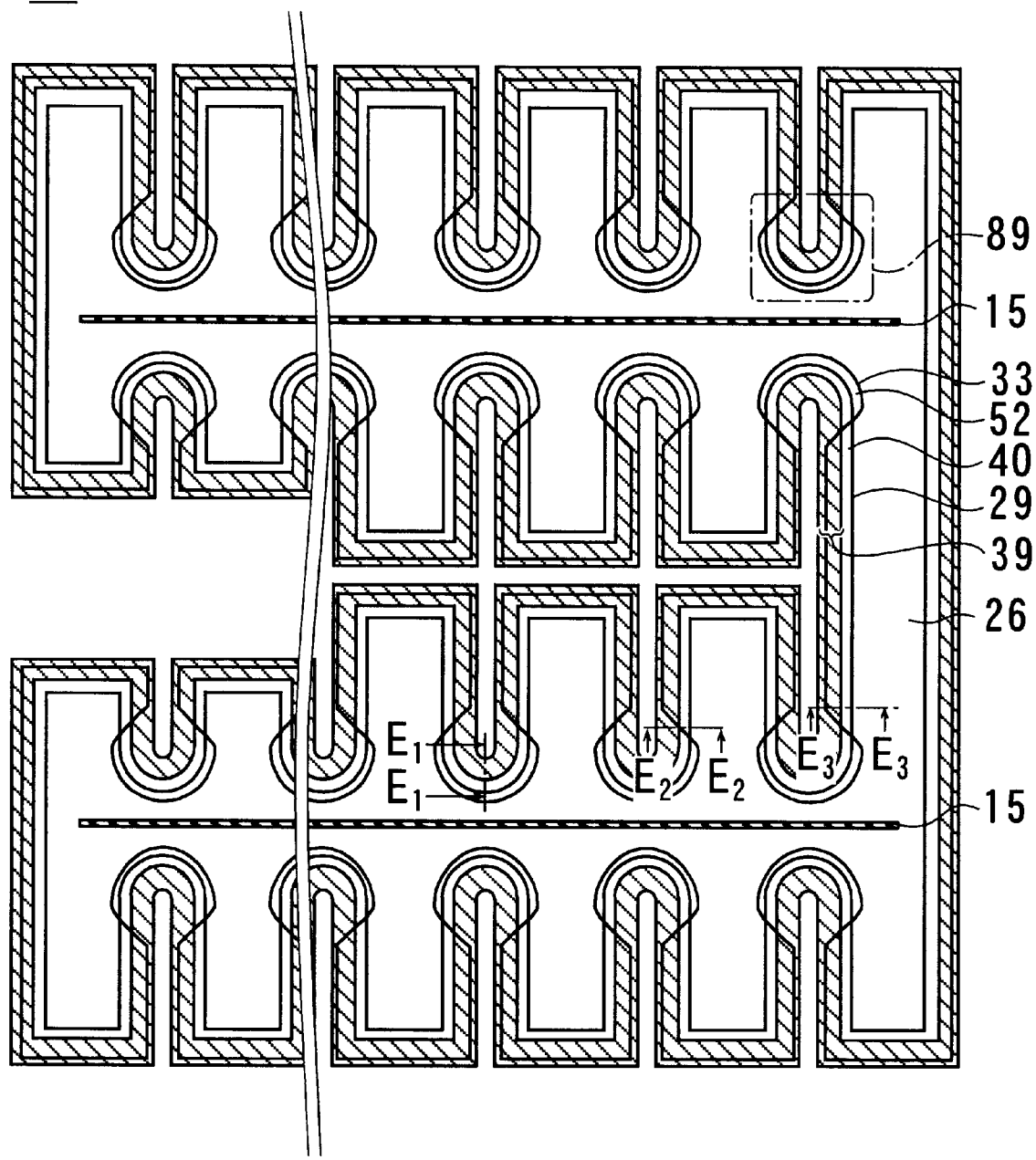
FIG. 32 is a view for illustrating a pattern among patterens of the field effective transistor of the present invention where a part of the ohmic region is gradually extending toward inside of N-type region.
Figure 33:
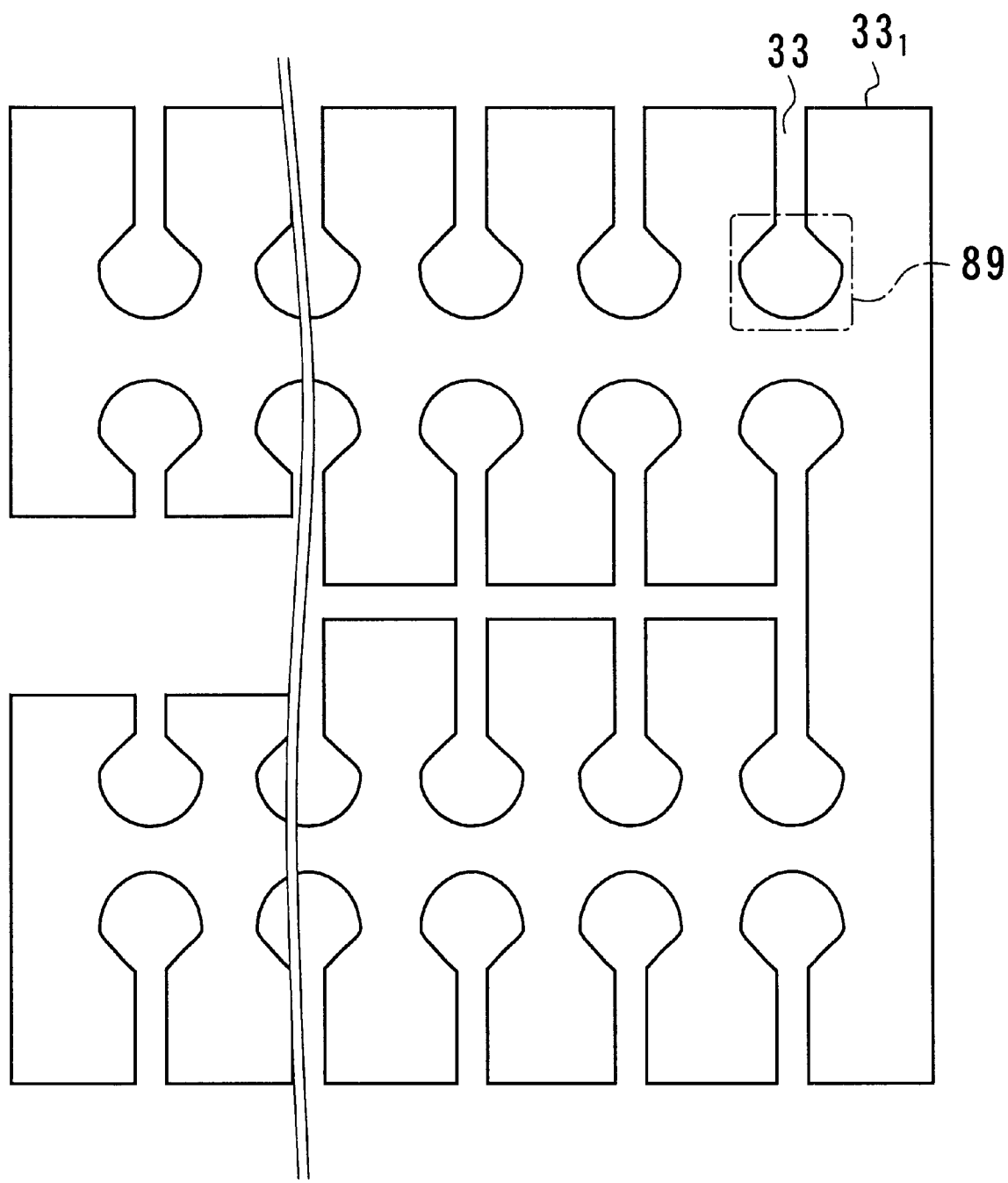
FIG. 33 is a view for illustrating the ohmic region in the pattern.

Reference numeral 82 of FIG. 32 shows a plan configuration of the ohmic region 33 gradually extending. At the tip part of the swelling portion 89, the ohmic region 33 is diffused into the inner part of the conductive region 26 beyond the inner periphery of the base region 29. The inner periphery of the ohmic region 33 becomes narrower toward the inside of the base region 29 as it gets closer to the root portion of the base region 29. The configuration of ohmic region 33 in the plan configuration 82 is shown in FIG. 33.

Figure 41A:
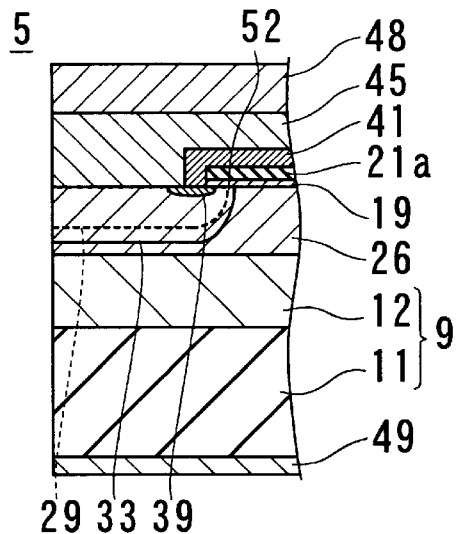
FIGS. 41(a) to 41(c) are cross sectional views for illustrating the pattern where a part of the ohmic region gradually extends toward inside of N-type region and are showing a tip portion, a middle portion, and a root portion, respectively.
Figure 41B:
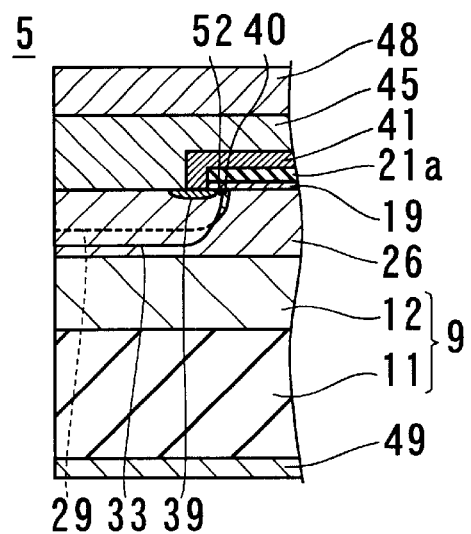
Figure 41C:
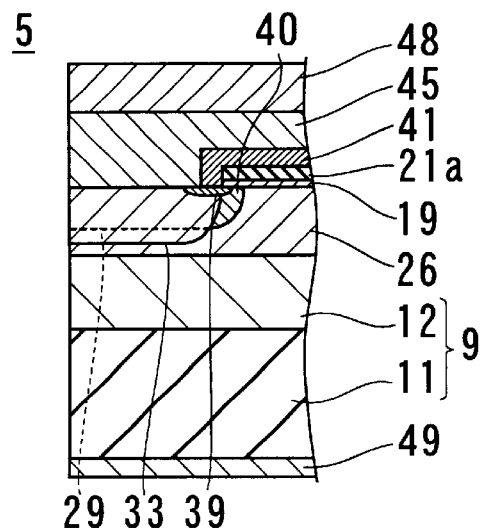

FIGS. 41(a) to 41(c) are cross-sectional views taken along the line $E_1$—$E_1$ at the tip portion of the swelling portion 89, the line $E_2$—$E_2$ at the portion where the size of the ohmic region varies, and the line $E_3$—$E_3$ at the root portion of the swelling portion 89 of FIG. 32, respectively. The ohmic region 33 of the swelling portion 89 is greatly diffused in a lateral direction into the conductive region 26 at the tip portion. The width of the root portion of the ohmic region 33 is the same as the width between the inner periphery of the ohmic region 33 and the inner periphery of base region 29 at the straight portions of the branch portion 24, the body portions $22_1$, $22_2$ or connecting portion 23.

When the gradually extending ohmic region 33 forms the swelling portion 89 as described above, the P-type high concentration region 32 which is a diffusion source of the ohmic region 33 can be formed by varying the amount of protrusion of the resist film 31 which is to be a mask of the P-type impurities from the edge of the gate electrode film 21a.

Figure 40A:
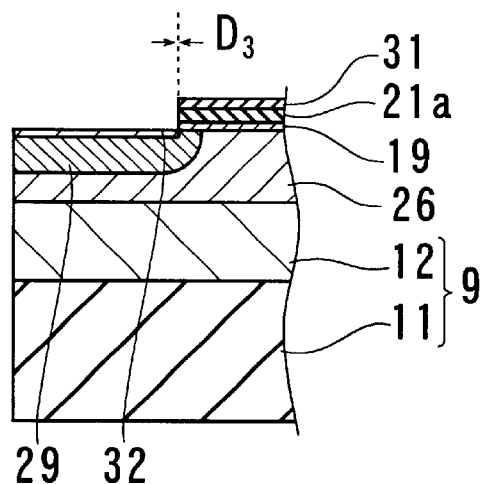
FIGS. 40(a) to 40(c) are cross sectional views for illustrating a manufacturing processes of the pattern where a part of the ohmic region gradually extends toward inside of N-type region and are showing a tip portion, a middle portion, and a root portion, respectively.
Figure 40B:
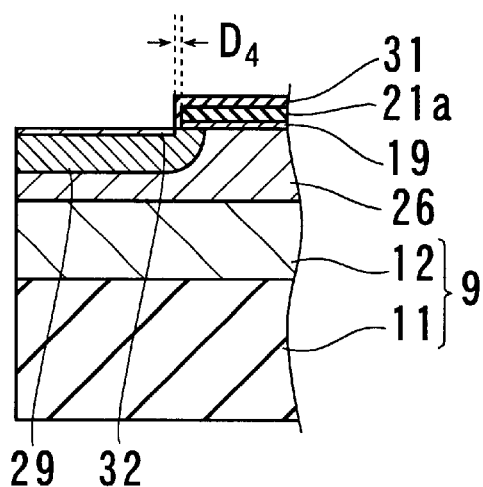
Figure 40C:
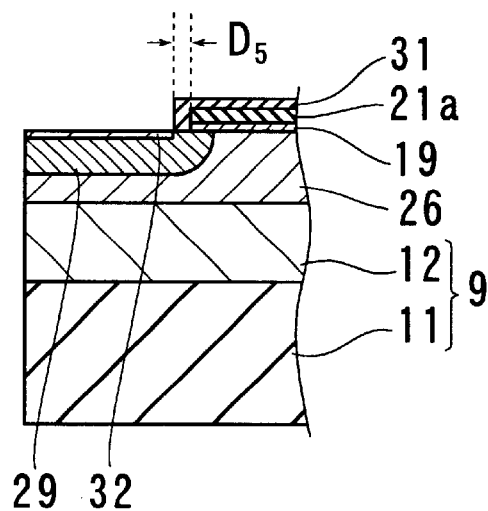

FIGS. 40(a) to 40(c) are views showing the protrusion amount of resist film 31, $D_3$, $D_4$ and $D_5$, to form the sections corresponding to the cross-sections along the line $E_1$—$E_1$, $E_2$—$E_2$, and $E_3$—$E_3$, respectively. Here, the relationship among the amount is $D_3 < D_4 < D_5$.

As described above, the gradually extending configuration of the ohmic region 33 can be formed by gradually reducing the protrusion amount of the resist film 31 from the root toward the tip of the swelling portion 89.

In this case, a channel region 40 is formed by the base region 29 at the root portion of the swelling portion 89, and a channel region 52 is formed by the ohmic region 33 at the tip portion. At the part between the root portion and the tip portion, the channel region 52 formed by the ohmic region 33 is brought into contact with the source region 39 and the channel region 40 formed by the base region 29 is arranged between the channel region 52 and the conductive region 26.

In the field effect transistor of the present invention, the ohmic region 33 is not necessarily extended in the lateral direction over the base region 29.

Figure 42:
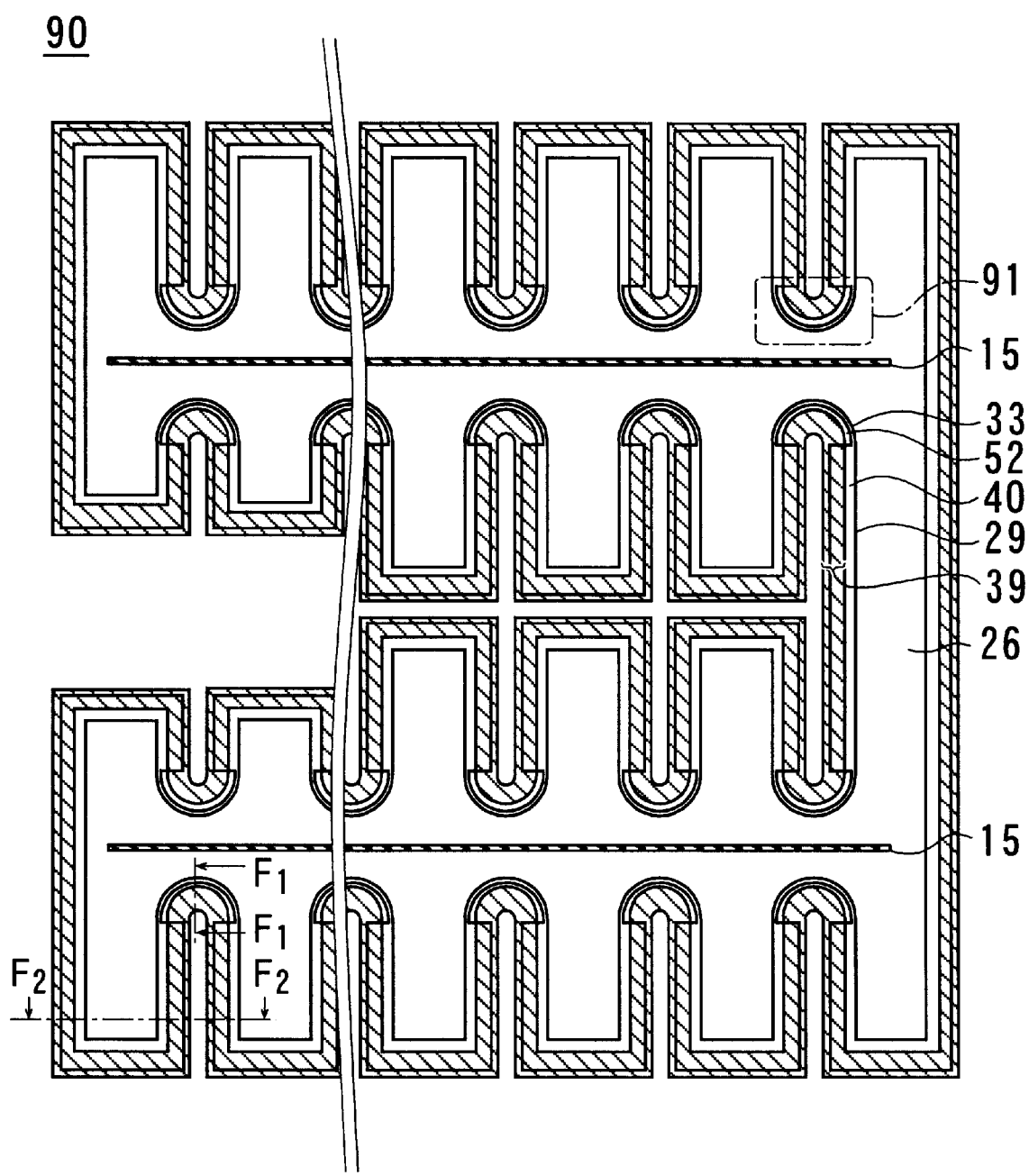
FIG. 42 is a view illustrating another plan pattern of the present invention.

The ohmic region 33 with plan configuration that is denoted by the reference numeral 90 of FIG. 42 has the similar configuration to the plan configuration 81 shown in FIG. 28 and the swelling portion 91 is extended toward the inside of N-type region surrounded by the channel region 40. The ohmic region 33 of the swelling portion 91 is wider than the part of the ohmic region 33 excluding the swelling portion 91 and is in a semicircular shape.

The ohmic region 33 of the swelling portion 91 in FIG. 42 is not extended into the N-type region beyond the base region 29 unlike the swelling portion 88 in a plan configuration 81 of FIG. 28.

Figure 44A:
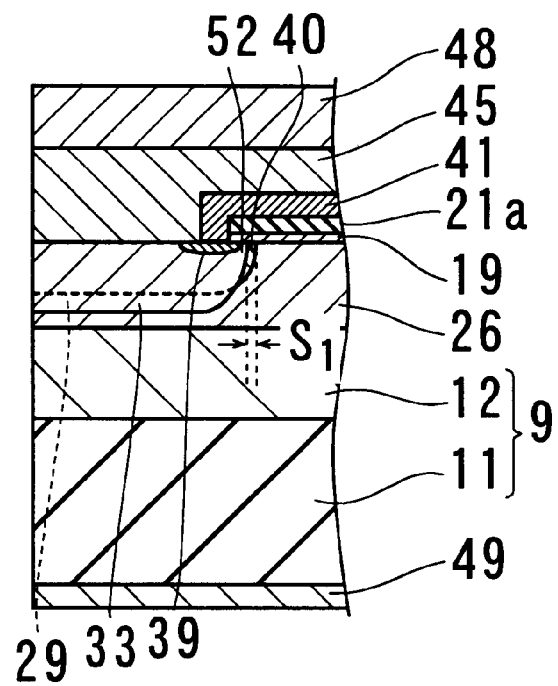
FIGS. 44(a) and 44(b) are cross sectional views of FIG. 42.

A cross-sectional view taken along the line $F_1$—$F_1$ of the swelling portion 91 is shown in FIG. 44(a). A cross-sectional view taken along the line $F_2$—$F_2$ of the part which is located between the branch portions 24 where the base region 29 and the ohmic region 33 are straight is shown in FIG. 44(b).

Figure 44B:
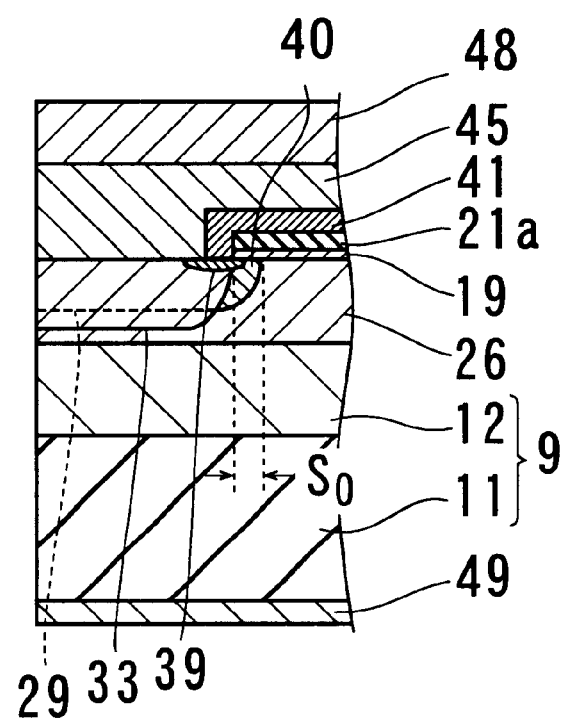

As shown in FIG. 44(b), the relation between $S_0$ and $S_1$ is $S_0 < S_1$ in the plan configuration 90 when $S_0$ is defined as a distance between the vicinity of the inner periphery of the straight portion of the base region and the vicinity of the inner periphery of the ohmic region 33 and $S_1$ is defined as a distance between the vicinity of the inner periphery of the base region 29 at the swelling portion 91 and the vicinity of the inner periphery of the ohmic region 33. Especially, when the distance $S_1$ is a negative value ($S_1 < 0$), the ohmic region 33 extends into the N-type region beyond the edge of the inner periphery of the base region 29 as shown in FIGS. 39(a)–39(c) and FIG. 41(a).

Figure 43A:
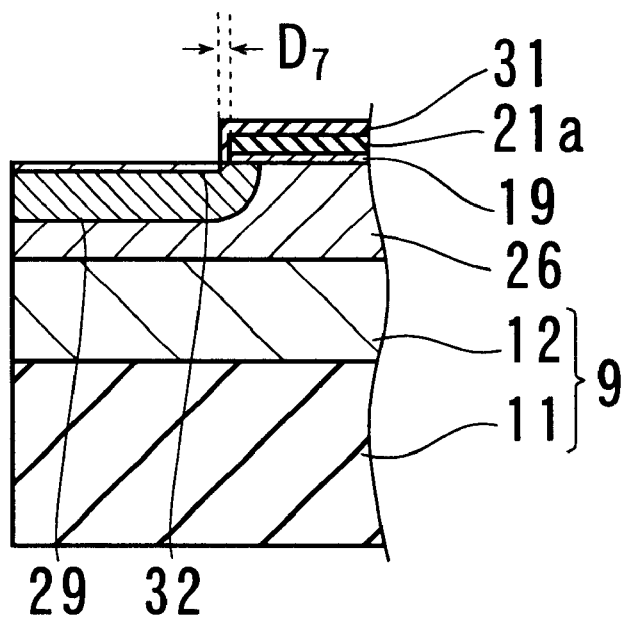
FIGS. 43(a) and 43(b) are views illustrating manufacturing processes of the swelling portion of the FIG. 42.
Figure 43B:
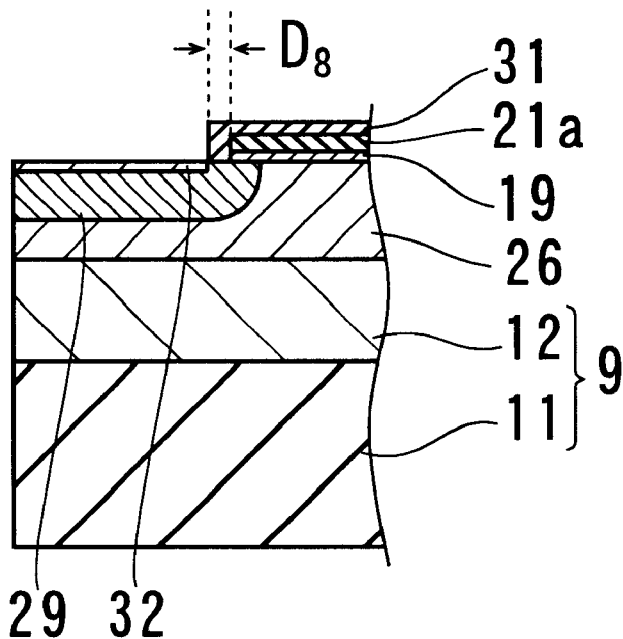

In order to form the swelling portion 91 described above, when P-type high concentration impurity layer 32 to be the ohmic region 33 is formed, as shown in FIG. 43(a), the protruded distance $D_7$ of the resist film 31 from the edge of the gate electrode film 21a in the swelling portion is made shorter than the protruded distance $D_8$ of the resist film 31 from the edge of the gate electrode film 21a in the portion formed in straight as shown in FIG. 43(b).

As described above, the amount that the base region 29 and the source region 39 diffused under the gate electrode film 21a is uniform everywhere along the outer periphery of the drain region because the base region 29 and the source region 39 are formed by injecting and diffusing P-type impurities and N-type impurities by using the gate electrode film 21a as a mask. To the contrary, the relative positional relationship between the inner periphery of the ohmic region 33 and the edge portion of the gate electrode film 21a can be adjusted by the protrusion amount $S_1$ of the resist film 31 from the edge of the gate electrode film 21a.

As described above, the field effect transistor of the present invention, by adjusting the protrusion amount $S_1$ of the resist film 31 in the swelling portion, widely includes the field effect transistor that has a pattern in which, out of the inner periphery of the ohmic region 33, the edge portion of the swelling portion 91 that forms the spherical junction is more extended inward than the edge portion of the body portions $22_1$ and $22_2$, the connecting portion 23 or the branch portion 24 that forms a cylindrical junction.

Figure 25A:
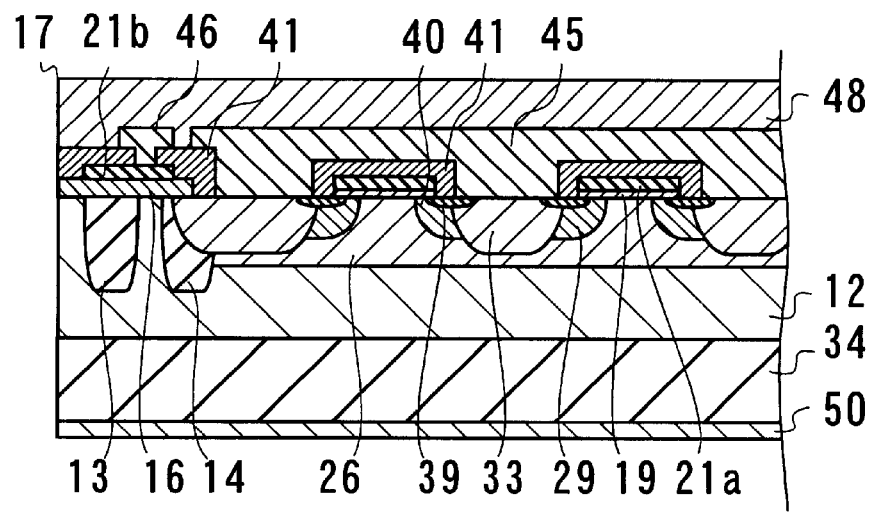
FIGS. 25(a) and 25(b) are views for illustrating an IGBT type field effect transistor using a Schottky junction of another example of the present invention, and a view for illustrating an IGBT type field effect transistor using a pn junction of a still other example of the present invention, respectively.

Incidentally, the case of manufacturing a field effect transistor has been explained in the above description. However, as shown in FIG. 25(a), the high resistance layer 12 is formed in place of the low resistance layer 11 on an N-type thin diode structure layer 34, and a metal film to be Schottky-connected to the diode structure layer 34 is formed on the back side of the diode structure layer 34 to be taken as an anode electrode film 50. Consequently, an IGBT type field effect transistor 2 using a Schottky junction can be obtained.

In this case, in a Schottky diode formed between the anode electrode film 50 and the diode structure layer 34, the drain electrode film 50 serves as an anode, while the diode structure layer 34 serves as a cathode. When the high resistance layer 34 used is not a single crystal silicon layer epitaxially grown, but a single crystal silicon wafer itself formed by a pulling method, the anode electrode film 50 may be formed on the back side of the high resistance layer 34 without providing the diode structure layer 34 to configure a Schottky diode.

Figure 25B:
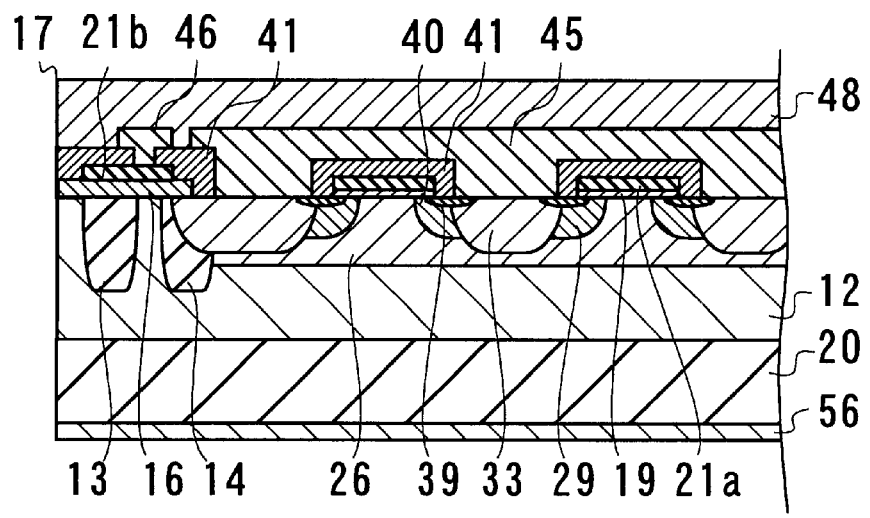
Figure 26:
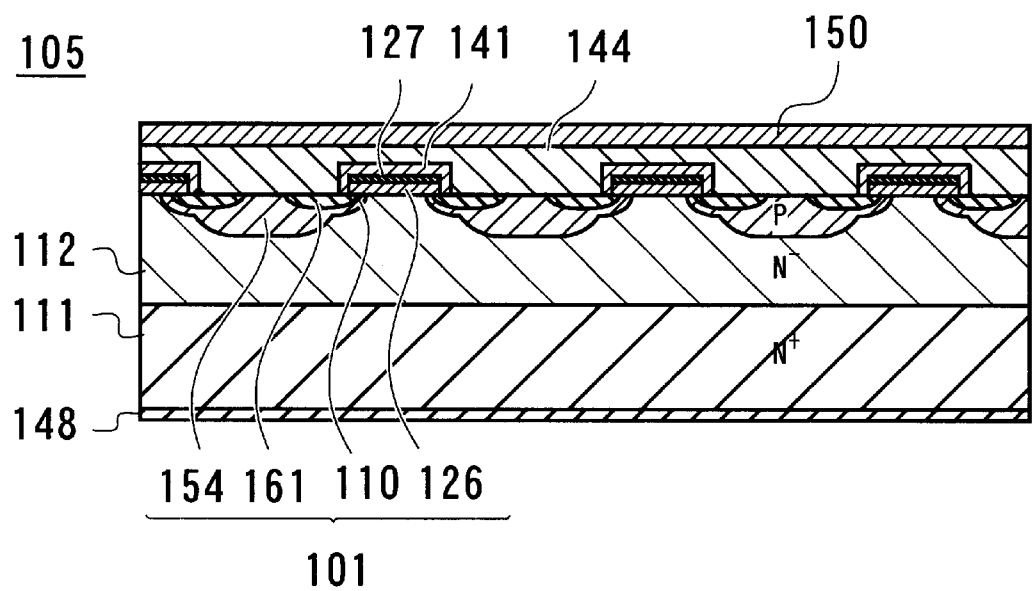
FIG. 26 is a view for illustrating a prior-art field effect transistor.
Figure 27:
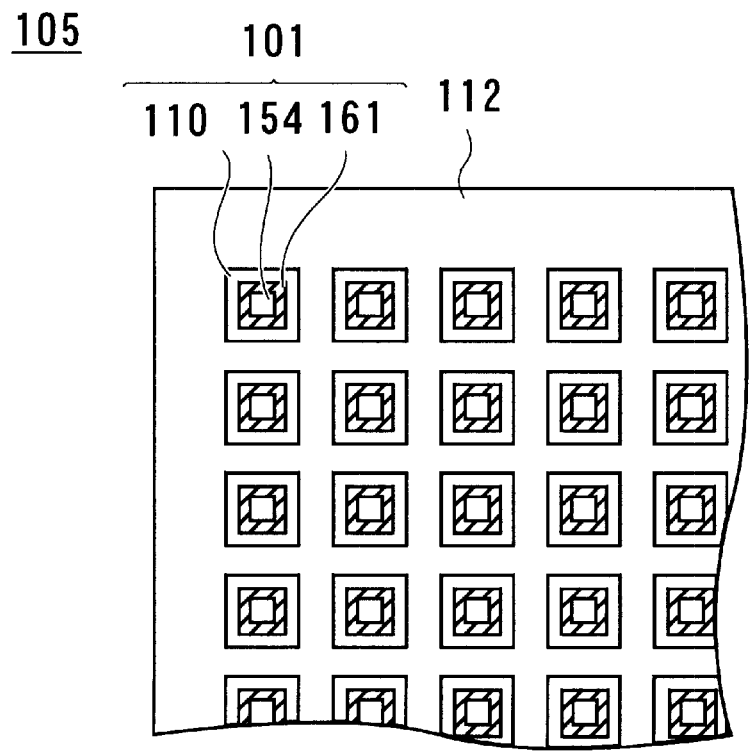
FIG. 27 is a view for illustrating the arrangement of cells of the field effect transistor.

Further, as shown in FIG. 25(b), a P-type single crystal silicon substrate is used in place of the N-type single crystal silicon layer 11 to be taken as a collector layer 20, and a collector electrode 56 to be ohmic connected to the collector layer 20 is formed at the collector layer 20, resulting in an IGBT type field effect transistor 3 using a pn junction. This field effect transistor 3 is also included in the present invention.

Each field effect transistors 1, 2, 3 comprises one source region 39 and one channel region 40.

Further, the high resistance layer 12 used above was the one epitaxially grown on the low resistance layer 11. However, it is also acceptable that the high resistance layer 12 is comprised of a high resistance silicon wafer itself, and impurities of the same conductivity type as that of the high resistance layer 12 are diffused from the back side of the high resistance layer 12 to configure a low resistance layer 11 with a lower resistance than that of the high resistance layer 12.

In the above examples, the N-type is a first conductivity type and the P-type is a second conductivity type. However, the P-type may be the first conductivity type and the N-type may be the second conductivity type. In this case, for example, the conductivity type of the high resistance layer and the source layer becomes P-type and the conductivity type of the base region becomes N-type.

Thus, a field effect transistor with a low conduction resistance and a high withstand voltage can be obtained.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A field effect transistor, comprising:
   a main diffused region of a second conductivity type formed within a high resistance layer of a first conductivity type, and disposed on the surface side of the high resistance layer;
   a source region of the first conductivity type formed within the main diffused region, and disposed on the surface thereof;
   a ring-shaped channel region being formed in a ring, being a part of the main diffused region, and located between the edge of the main diffused region and the edge of the source region;
   a drain region surrounded by the ring-shaped channel region;
   a gate insulation film disposed at least on the channel region surface; and
   a gate electrode film disposed on the gate insulation film surface,
   the source region being located at an outer periphery of the ring-shaped channel region,
   the source region and the high resistance region being electrically connected with each other upon inversion of the channel region surface into the first conductivity type due to a voltage applied to the gate electrode film,
   wherein the drain region surrounded by the ring-shaped channel region has at least one narrow elongate body portion, and a plurality of branch portions with their respective one ends connected to the body portion, and the ring-shaped channel region is disposed so as to surround the periphery of the body portion and the branch portions,
   wherein the body portion located between the branch portions extends roundly toward the inside of the body portion itself,
   wherein the main diffused region comprises a P-type base region and a P-type ohmic region having a deeper diffusion depth than that of the base region, a conductive layer of the first conductivity type with a lower resistance than that of the high resistance layer is disposed in the vicinity of the surface inside of the drain region, a pn junction is formed with the ohmic region and the conductive region at least on the surface of the tip portion of the portion extending roundly toward the inside of the body portion.

2. The field effect transistor according to claim 1, wherein the channel region at each tip of the branch portions is configured with three sides intersecting with each other at substantially right angles.

3. The field effect transistor according to claim 1, wherein a conductive layer of the first conductivity type with a lower resistance than that of the high resistance layer is disposed in each of the branch portions.

4. A field effect transistor, comprising:
   a main diffused region of a second conductivity type formed within a high resistance layer of a first conductivity type, and disposed on the surface side of the high resistance layer;
   a source region of the first conductivity type formed within the main diffused region, and disposed on the surface thereof;
   a ring-shaped channel region being formed in a ring, being a part of the main diffused region, and located between the edge of the main diffused region and the edge of the source region;
   a drain region surrounded by the ring-shaped channel region;
   a gate insulation film disposed at least on the channel region surface; and
   a gate electrode film disposed on the gate insulation film surface,
   the source region being located at an outer periphery of the ring-shaped channel region,
   the source region and the high resistance region being electrically connected with each other upon inversion of the channel region surface into the first conductivity type due to a voltage applied to the gate electrode film,
   wherein the drain region surrounded by the ring-shaped channel region has at least one narrow elongate body portion, and a plurality of branch portions with their respective one ends connected to the body portion, and the ring-shaped channel region is disposed so as to surround the periphery of the body portion and the branch portions,
   wherein a floating potential region of the second conductivity type not in contact with the channel region is disposed on the surface side of the inside of the drain region.

5. The field effect transistor according to claim 1, wherein the high resistance layer is disposed on a low resistance layer of the first conductivity type with a lower resistance than that of the high resistance layer, and
   a drain electrode film for forming an ohmic junction with the low resistance layer is disposed on the back side of the low resistance layer.

6. A field effect transistor, comprising:
   a main diffused region of a second conductivity type formed within a high resistance layer of a first conductivity type, and disposed on the surface side of the high resistance layer;
   a source region of the first conductivity type formed within the main diffused region, and disposed on the surface thereof;
   a ring-shaped channel region being formed in a ring, being a part of the main diffused region, and located between the edge of the main diffused region and the edge of the source region;
   a drain region surrounded the ring-shaped channel region;
   a gate insulation film disposed at least on the channel region surface; and
   a gate electrode film disposed on the gate insulation film surface, the source region being located at an outer periphery of the ring-shaped channel region, the source region and the high resistance region being electrically connected with each other upon inversion of the channel region surface into the first conductivity type due to a voltage applied to the gate electrode film, wherein an anode electrode film for forming a Schottky junction with the high resistance layer is disposed on the back side of the high resistance layer, such that a diode in which the anode electrode film is taken as an anode, and the high resistance layer is taken as a cathode is formed.

7. The field effect transistor according to claim 1, wherein the high resistance layer is disposed on a collector layer of the second conductivity type, and a collector electrode film for forming an ohmic junction with the collector layer is disposed on the back side of the collector layer.

* * * * *